United States Patent
Pi et al.

(10) Patent No.: US 12,119,282 B2
(45) Date of Patent: Oct. 15, 2024

(54) METHOD OF MAKING A SEMICONDUCTOR DEVICE PACKAGE

(71) Applicant: Advanced Semiconductor Engineering, Inc., Kaohsiung (TW)

(72) Inventors: Tun-Ching Pi, Kaohsiung (TW); Yen-Chi Huang, Kaohsiung (TW); Hao-Chih Hsieh, Kaohsiung (TW); Jin Han Shih, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/876,468

(22) Filed: Jul. 28, 2022

(65) Prior Publication Data

US 2022/0367308 A1 Nov. 17, 2022

Related U.S. Application Data

(63) Continuation of application No. 16/409,665, filed on May 10, 2019, now abandoned.

(60) Provisional application No. 62/728,720, filed on Sep. 7, 2018.

(51) Int. Cl.
*H01L 21/56* (2006.01)
*H01L 23/31* (2006.01)
*H05K 1/18* (2006.01)

(52) U.S. Cl.
CPC ........ *H01L 23/3157* (2013.01); *H01L 21/565* (2013.01); *H01L 21/568* (2013.01); *H05K 1/185* (2013.01)

(58) Field of Classification Search
CPC .. H01L 23/3157; H01L 21/56; H01L 23/3121
See application file for complete search history.

(56) References Cited

U.S. PATENT DOCUMENTS

| | | | |
|---|---|---|---|
| 7,829,992 B2 | 11/2010 | Sugino et al. | |
| 7,872,343 B1 | 1/2011 | Berry | |
| 2004/0110340 A1* | 6/2004 | Kim | H10B 12/09 257/E21.255 |
| 2006/0110941 A1* | 5/2006 | Yen | H01L 21/76808 257/E21.259 |
| 2006/0151203 A1 | 7/2006 | Krueger et al. | |
| 2006/0163587 A1 | 7/2006 | Erchak et al. | |
| 2007/0131648 A1* | 6/2007 | Shim | B41J 2/1631 216/27 |
| 2010/0090322 A1 | 4/2010 | Hedler et al. | |
| 2010/0200898 A1 | 8/2010 | Lin et al. | |

(Continued)

FOREIGN PATENT DOCUMENTS

CN 104347558 A 2/2015

OTHER PUBLICATIONS

Final Office Action for U.S. Appl. No. 16/409,665, issued, Apr. 29, 2022, 22 pages.

(Continued)

*Primary Examiner* — Michele Fan
(74) *Attorney, Agent, or Firm* — FOLEY & LARDNER LLP

(57) ABSTRACT

A semiconductor device package includes a carrier and an encapsulant disposed on the carrier. At least one portion of the encapsulant is spaced from the carrier by a space.

12 Claims, 34 Drawing Sheets

(56) References Cited

U.S. PATENT DOCUMENTS

| | | | |
|---|---|---|---|
| 2010/0237039 A1* | 9/2010 | Candler | B81C 1/00682 216/17 |
| 2011/0115066 A1 | 5/2011 | Kim et al. | |
| 2011/0210444 A1 | 9/2011 | Jeng et al. | |
| 2011/0266674 A1* | 11/2011 | Hsia | H01L 25/50 257/745 |
| 2012/0193779 A1 | 8/2012 | Lee et al. | |
| 2013/0093088 A1 | 4/2013 | Chau et al. | |
| 2013/0257462 A1 | 10/2013 | Ding et al. | |
| 2015/0287672 A1 | 10/2015 | Yazdani | |
| 2016/0126220 A1 | 5/2016 | Chen et al. | |
| 2017/0103951 A1 | 4/2017 | Lee et al. | |
| 2017/0243826 A1 | 8/2017 | Lin et al. | |
| 2017/0287825 A1 | 10/2017 | Lee et al. | |
| 2018/0090449 A1 | 3/2018 | Jeong et al. | |
| 2018/0158768 A1 | 6/2018 | Kim et al. | |
| 2018/0269181 A1 | 9/2018 | Yang et al. | |
| 2019/0057931 A1 | 2/2019 | Hsu et al. | |
| 2019/0074267 A1 | 3/2019 | Yang et al. | |
| 2019/0088621 A1 | 3/2019 | Yang et al. | |
| 2019/0139853 A1 | 5/2019 | Oh et al. | |
| 2019/0206813 A1 | 7/2019 | Kim et al. | |
| 2019/0378795 A1 | 12/2019 | Lee et al. | |
| 2021/0272922 A1* | 9/2021 | Alves Dias | H01L 24/37 |

OTHER PUBLICATIONS

Final Office Action for U.S. Appl. No. 16/560,862, issued Feb. 15, 2022, 13 pages.
Final Action for U.S. Appl. No. 16/409,665, issued Apr. 16, 2021, 20 pages.
Non-Final Office Action for U.S. Appl. No. 16/409,665, issued Nov. 17, 2021, 19 pages.
Non-Final Office Action for U.S. Appl. No. 16/409,665, issued Oct. 19, 2020, 15 pages.
Non-Final Office Action for U.S. Appl. No. 16/560,862, issued Apr. 13, 2021, 13 pages.
Notice of Allowance for U.S. Appl. No. 16/560,862, issued May 2, 2022, 8 pages.
Non-Final Office Action for U.S. Appl. No. 17/903,921, issued Mar. 30, 2023, 13 pages.
Final Office Action for U.S. Appl. No. 17/903,921, issued Oct. 12, 2023, 16 pages.
Non-Final Office Action for U.S. Appl. No. 17/903,921, issued Apr. 10, 2024, 13 pages.

* cited by examiner

METHOD OF MAKING A SEMICONDUCTOR DEVICE PACKAGE

CROSS-REFERENCE TO RELATED APPLICATIONS

This application is a continuation of U.S. patent application Ser. No. 16/409,665 filed May 10, 2019, which claims the benefit of and priority to U.S. Provisional Application No. 62/728,720, filed Sep. 7, 2018, the contents of which are incorporated herein by reference in their entireties.

BACKGROUND

1. Field of the Disclosure

The instant disclosure relates to, amongst other things, a semiconductor device package, and a semiconductor device package having an area or space devoid of an encapsulating material.

2. Description of Related Art

A molding process is a packaging technology for a semiconductor package, which is used to protect a substrate and components on the substrate. However, in some implementations not all regions of the substrate should be covered by the encapsulating material (also referred to as a molding compound), such as in antenna-on-package (AoP) implementations, in which it may be desirable to perform impedance matching of a path from a component to an antenna. Thus, a semiconductor device package can have a non-molding area or space (an area or space devoid of the encapsulating material), and a user can readily adjust the impedance matching by adjusting surface mount technology (SMT) passive components after the molding process.

SUMMARY

According to one example embodiment of the instant disclosure, a semiconductor device package includes a carrier and an encapsulant disposed on the carrier. Further, at least one portion of the encapsulant is spaced from the carrier by a space.

According to another example embodiment of the instant disclosure, a semiconductor device package comprises a carrier comprising a first surface and a second surface adjacent to the first surface, and an encapsulant disposed on the first surface of the carrier. Further, a roughness of the second surface of the carrier is greater than a roughness of the first surface of the carrier.

According to another example embodiment of the instant disclosure, method of manufacturing a semiconductor device package includes: a) providing a carrier having a surface; b) forming a sacrificial layer on the surface of the carrier; c) encapsulating the carrier and the sacrificial layer by an encapsulant; d) removing a portion of the encapsulant to expose a portion of the sacrificial layer such that the encapsulant is divided into a first portion and a second portion, wherein the first portion of the encapsulant is attached to the carrier and the second portion of the encapsulant is attached to the sacrificial layer; and e) removing the sacrificial layer and the second portion of the encapsulant.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

DETAILED DESCRIPTION

The aforementioned illustrations and following detailed descriptions are examples for the purpose of explaining the instant disclosure.

Figure 1:
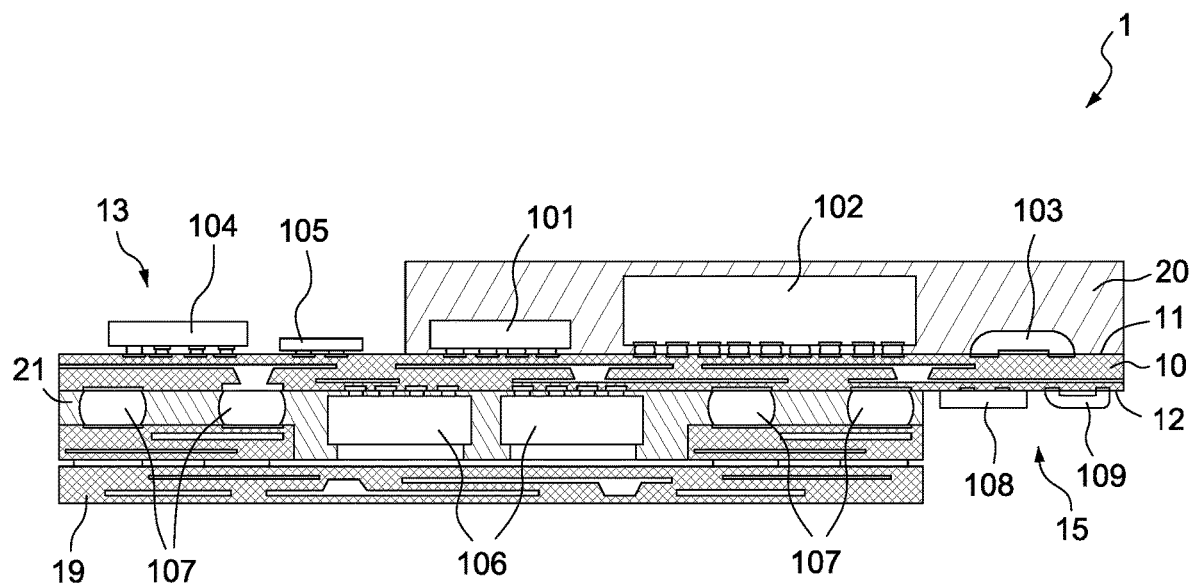
FIG. 1 is a cross-sectional view of a semiconductor device package in accordance with an embodiment of the instant disclosure.

FIG. 1 shows a semiconductor device package 1 in accordance with an embodiment of the instant disclosure. In particular, the semiconductor device package 1 has two non-symmetrical non-molding areas 13 and 15. As used herein, the term "non-molding area" can refer to an area (e.g. an area of a substrate) or a space substantially devoid of molding material. With reference to FIG. 1, the semiconductor device package 1 comprises a carrier 10. The carrier 10 has an upper surface 11 and a lower surface 12 opposite to the upper surface 11. An encapsulating material 20 is disposed on the upper surface 11 of the carrier 10. A die 101 and components 102, 103 (e.g., electronic components, such as passive electronic components) are disposed on the disposed on the upper surface 11 of the carrier 10 and covered by the encapsulating material 20. As shown in FIG. 1, one or more regions of the upper surface 11 of the carrier 10 are exposed from the encapsulating material 20 (e.g., are substantially devoid of the encapsulating material 20). The upper surface 11 of the carrier 10 has a non-molding area 13. In the non-molding area 13, there is substantially no encapsulating material 20 disposed on the upper surface 11 of the carrier 10, and the die 104 and the component 105 disposed on the upper surface 11 of the carrier 10 are not covered by the encapsulating material 20 and thus are exposed. Further, an encapsulating material 21 is disposed on the lower surface 12 of the carrier 10. Dies 106 and electrical contacts 107 are disposed on the lower surface 12 of the carrier 10 and covered by the encapsulating material 21. In addition, a substrate 19 is disposed on the encapsulating material 21. Further, one or more regions of the lower surface 12 of the carrier 10 are exposed from the encapsulating material 21 (e.g., are substantially devoid of the encapsulating material 21). The lower surface 12 of the carrier 10 has a non-molding area 15. In the non-molding area 15, there is substantially no encapsulating material 21 disposed on the lower surface 12 of the carrier 10, and the components 108 and 109 disposed on the lower surface 12 of the carrier 10 are not covered by the encapsulating material 21 and thus are exposed.

Moreover, referring to FIG. 1, the non-molding areas 13 and 15 are different from each other and the positions of them do not correspond to each other (e.g. are not disposed opposite to each other). The non-molding area 13 on the upper surface 11 of the carrier 10 and the non-molding area 15 on the lower surface 12 of the carrier 10 are not symmetrical to each other.

Figure 2A:
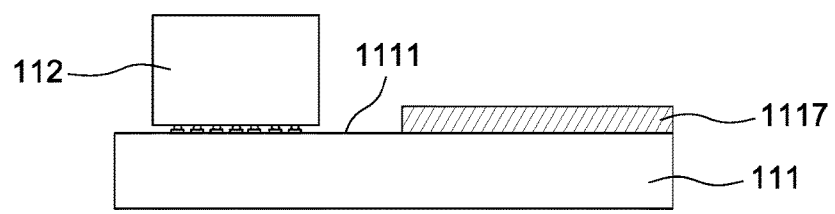
FIG. 2A, FIG. 2B, FIG. 2C and FIG. 2D show a method of manufacturing a semiconductor device package in accordance with an embodiment of the instant disclosure.

FIG. 2A, FIG. 2B, FIG. 2C and FIG. 2D show a method of manufacturing a semiconductor device package 110 in accordance with an embodiment of the instant disclosure. As shown in FIG. 2A, at least one electronic component 112 is disposed on an upper surface 1111 of a carrier 111. Further, in some embodiments, a glue is dispensed on the upper surface 1111 of the carrier 111 so as to form a removable/sacrificial layer 1117 on the upper surface 1111 of the carrier 111. In some embodiments, the removable/sacrificial layer 1117 can include a tape adhered or taped on the upper surface 1111 of the carrier 111 or another removable binding material coated or printed on the upper surface 1111 of the carrier 111.

Figure 2B:
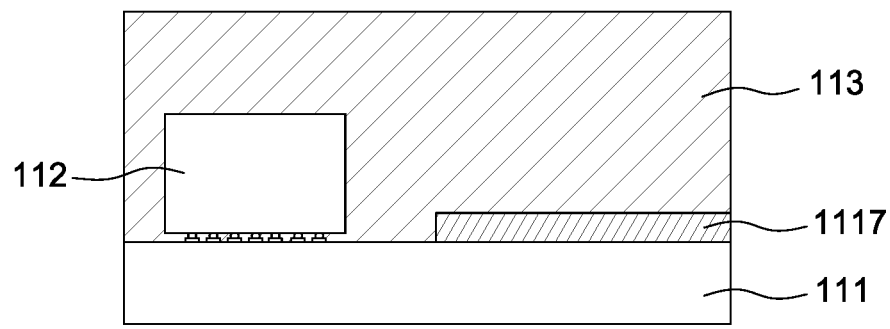

With reference to FIG. 2B, an encapsulating material 113 is disposed on the carrier 111 and encapsulates the at least one electronic component 112 and the removable/sacrificial layer 1117. The encapsulating material 113 covers the at least one electronic component 112, the upper surface 111 of the carrier 11 and the removable/sacrificial layer 1117.

Figure 2C:
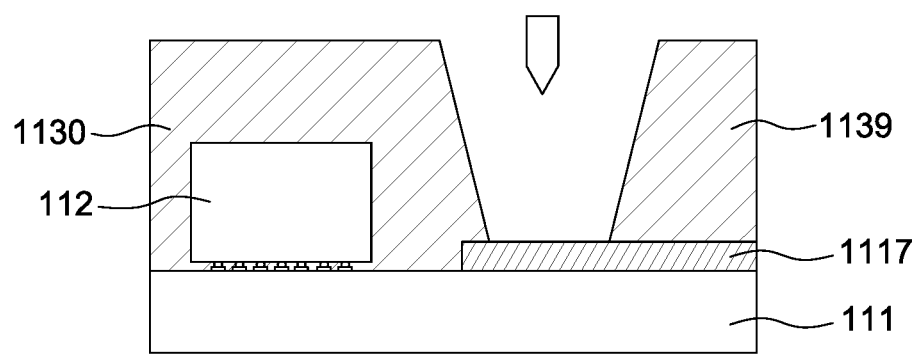

With reference to FIG. 2C, a portion of the encapsulating material 113 is removed by a laser process and thus a portion of the removable/sacrificial layer 1117 is exposed. Thereby, the encapsulating material 113 is divided into two portions 1130 and 1139, wherein the portion of the encapsulating material 1130 is attached to the upper surface 1111 of the carrier 111 and the removable/sacrificial layer 1117, and the portion of the encapsulating material 1139 is attached to the removable/sacrificial layer 1117.

Figure 2D:
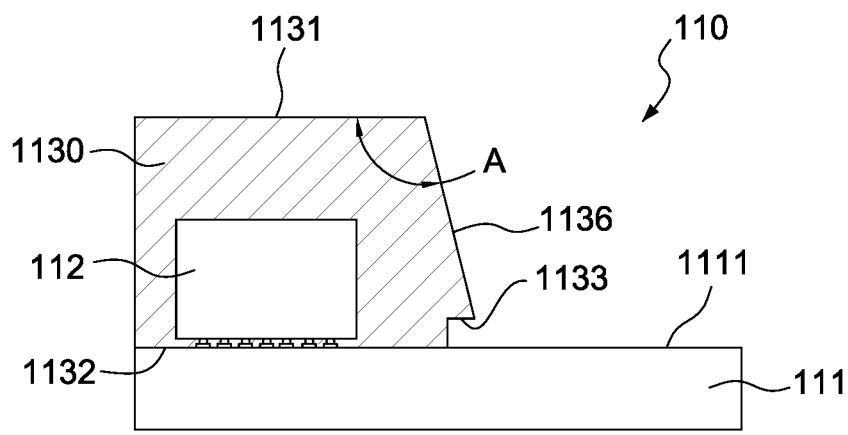

With reference to FIG. 2D, the removable/sacrificial layer 1117 is removed by physical methods or chemical methods, such as a water washing process. Further, the portion of the encapsulating material 1139 attached to the removable/sacrificial layer 1117 is removed too (e.g., is removed while removing the removable/sacrificial layer 1117). After removing the removable/sacrificial layer 1117 and the portion of the encapsulating material 1139, the portion of the encapsulating material 1130 remains on the carrier 111 and a portion of the upper surface 1111 of the carrier 111 is exposed. The portion of the encapsulating material 1130 is disposed on the upper surface 1111 of the carrier. The portion of the encapsulating material 1130 has an upper surface 1131 and a lower surface 1132 which is opposite to the upper surface 1131 and attached to the upper surface 1111 of the carrier 111. In addition, the portion of the encapsulating material 1130 further has a surface 1133 at a height between that of the upper surface 1131 and the lower surface 1132, wherein the surface 1133 is spaced from the upper surface 1111 of the carrier 111. There is a space between the surface 1133 and the upper surface 1111. The surface 1133 may be substantially parallel to either or each of the upper surface 1131 and the lower surface 1132.

Moreover, the portion of the encapsulating material 1130 has a side surface 1136. The side surface 1136 may connect the surface 1133 and the upper surface 1131. An angle A between the side surface 1136 and the upper surface 1131 ranges from about 90 degrees to about 110 degrees.

Figure 3A:
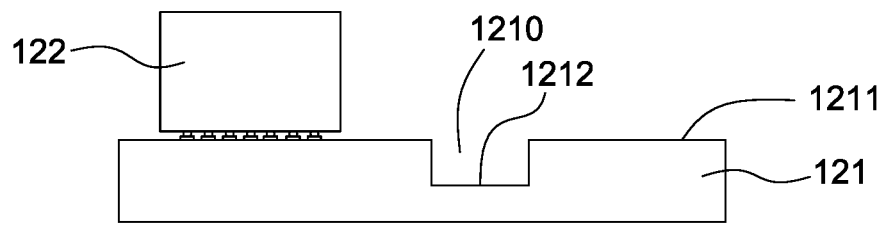
FIG. 3A, FIG. 3B, FIG. 3C, FIG. 3D and FIG. 3E show a method of manufacturing a semiconductor device package in accordance with another embodiment of the instant disclosure.

FIG. 3A, FIG. 3B, FIG. 3C, FIG. 3D and FIG. 3E show a method of manufacturing a semiconductor device package 120 in accordance with another embodiment of the instant disclosure. As shown in FIG. 3A, a carrier 121 has an upper surface 1211 and a recess 1210 formed in the upper surface 1211. The carrier 121 has a recessed surface 1212 (e.g. that defines a bottom of the recess 1210) recessed with respect to the upper surface 1211. At least one electronic component 122 is disposed on the upper surface 1211 of the carrier 121.

Figure 3B:
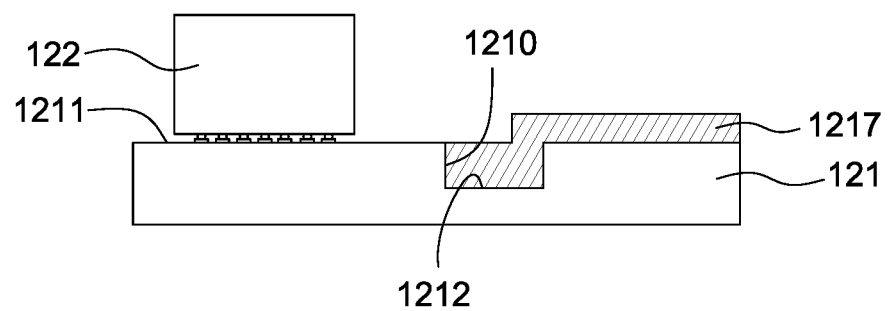

Further, with reference to FIG. 3B, a glue is dispensed on the upper surface 1211 of the carrier 121, wherein a portion of the glue flows into the recess 1210. Thus, a removable/sacrificial layer 1217 is formed on the upper surface 1211 and the recessed surface 1212 of the carrier 121.

Figure 3C:
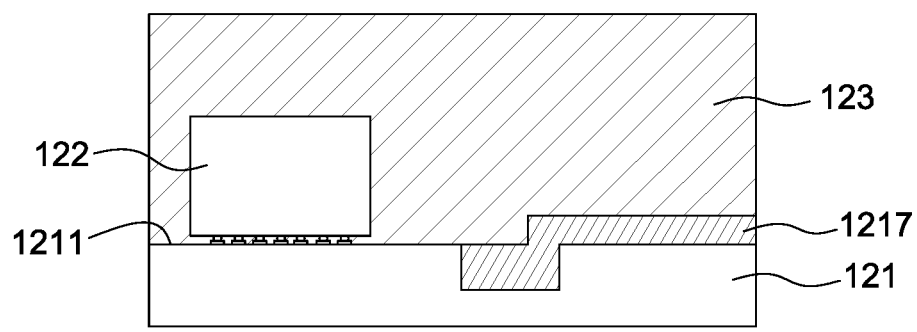

With reference to FIG. 3C, an encapsulating material 123 is disposed on the carrier 121 and encapsulates the at least one electronic component 122 and the removable/sacrificial layer 1217. The encapsulating material 123 covers the at least one electronic component 122, the upper surface 1211 of the carrier 121 and the removable/sacrificial layer 1217.

Figure 3D:
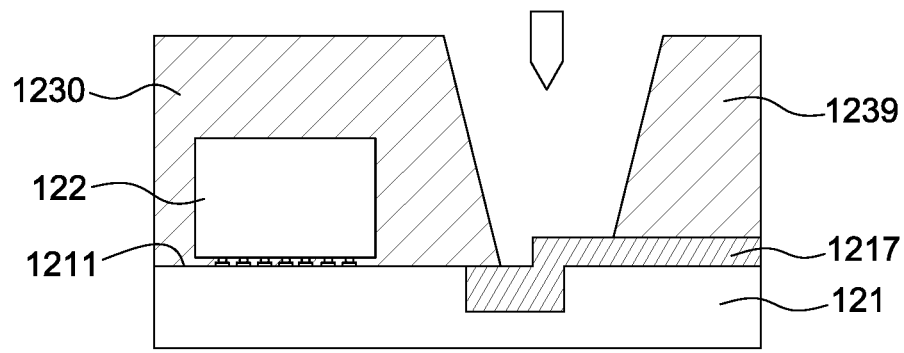

With reference to FIG. 3D, a portion of the encapsulating material 123 is removed by a laser process and thus a portion of the removable/sacrificial layer 1217 is exposed. Thereby, the encapsulating material 123 is divided into two portions 1230 and 1239, wherein the portion of the encapsulating material 1230 is attached to the upper surface 1211 of the carrier 121 and the removable/sacrificial layer 1217, and the portion of the encapsulating material 1239 is attached to the removable/sacrificial layer 1217.

Figure 3E:
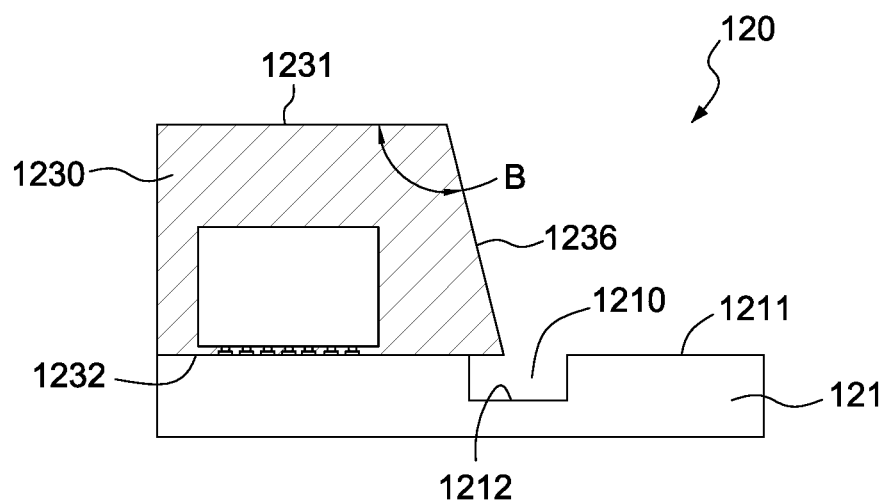

With reference to FIG. 3E, the removable/sacrificial layer 1217 is removed by physical methods or chemical methods, such as a water washing process. The portion of the encapsulating material 1239 attached to the removable/sacrificial layer 1217 is removed (e.g. while removing the removable/sacrificial layer 1217). After removing the removable/sacrificial layer 1217 and the portion of the encapsulating material 1239, the portion of the encapsulating material 1230 remains on the carrier 121 and a portion of the upper surface 1211 and the recessed surface 1212 of the carrier 121 are exposed. The portion of the encapsulating material 1230 is disposed on the upper surface 1211 of the carrier 121. The portion of the encapsulating material 1230 has an upper surface 1231 and a lower surface 1232 which is opposite to the upper surface 1231. Further, a portion of the lower surface 1232 is spaced from the recessed surface 1212 of the carrier 121 (e.g. is spaced from and disposed over the recessed surface 1212 of the carrier 121) and a portion of the lower surface 1232 is attached to the upper surface 1211 of the carrier 121. There is a space between the lower surface 1232 and the recessed surface 1212.

Moreover, the portion of the encapsulating material 1230 has a side surface 1236. An angle B between the side surface 1236 and the upper surface 1231 ranges from about 90 degrees to about 110 degrees.

Figure 4A:
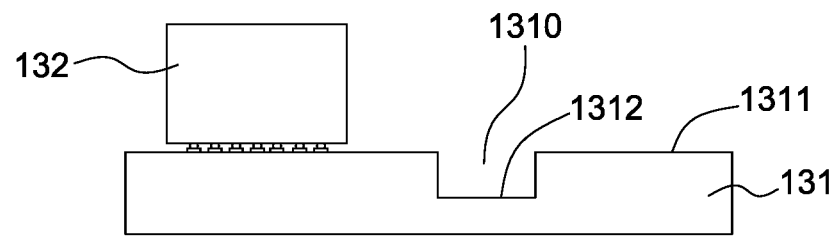
FIG. 4A, FIG. 4B, FIG. 4C, FIG. 4D and FIG. 4E show a method of manufacturing a semiconductor device package in accordance with another embodiment of the instant disclosure.

FIG. 4A, FIG. 4B, FIG. 4C, FIG. 4D and FIG. 4E show a method of manufacturing a semiconductor device package 130 in accordance with another embodiment of the instant disclosure. As shown in FIG. 4A, a carrier 131 has an upper surface 1311 and a recess 1310 formed in the upper surface 1311. The carrier 131 further has a recessed surface 1312 (e.g. that defines a bottom of the recess 1310) recessed with respect to the upper surface 1311. At least one electronic component 132 is disposed on the upper surface 1311 of the carrier 131.

Figure 4B:
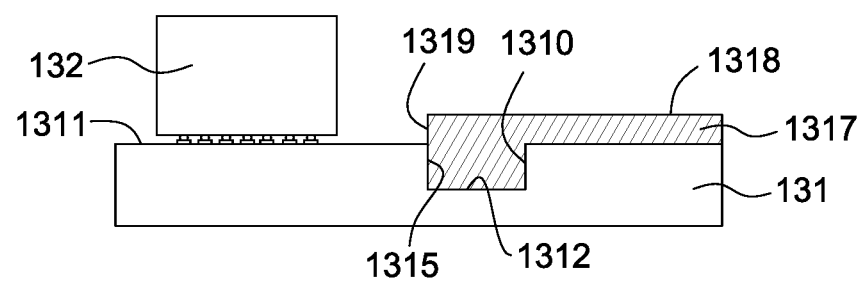

Further, with reference to FIG. 4B, a glue is dispensed on the upper surface 1311 of the carrier 131, wherein a portion of the glue flows into the recess 1310. Thus, a removable/sacrificial layer 1317 is formed on the upper surface 1311 and the recessed surface 1312 of the carrier 131. The removable/sacrificial layer 1317 has an upper surface 1318 higher than the upper surface 1311 of the carrier 131. Moreover, the removable/sacrificial layer 1317 has a side surface 1319, which is substantially coplanar with a side surface 1315 of the recess 1310.

Figure 4C:
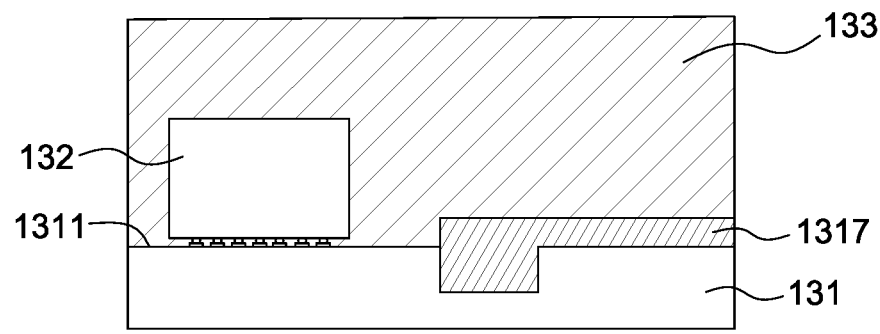

With reference to FIG. 4C, an encapsulating material 133 is disposed on the carrier 131 and encapsulates the at least one electronic component 132 and the removable/sacrificial layer 1317. The encapsulating material 133 covers the at least one electronic component 132, the upper surface 1311 of the carrier 131 and the removable/sacrificial layer 1317.

Figure 4D:
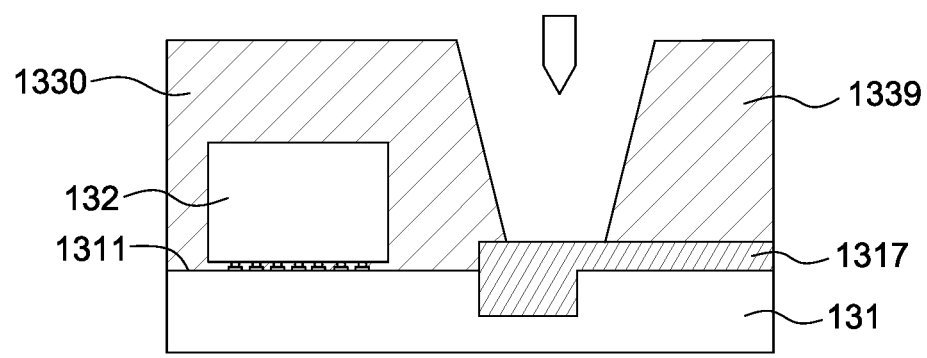

With reference to FIG. 4D, a portion of the encapsulating material 133 is removed by a laser process and thus a portion of the removable/sacrificial layer 1317 is exposed. Thereby, the encapsulating material 133 is divided into two portions 1330 and 1339, wherein the portion of the encapsulating material 1330 is attached to the upper surface 1311 of the carrier 131 and the removable/sacrificial layer 1317 and the portion of the encapsulating material 1339 is attached to the removable/sacrificial layer 1317.

Figure 4E:
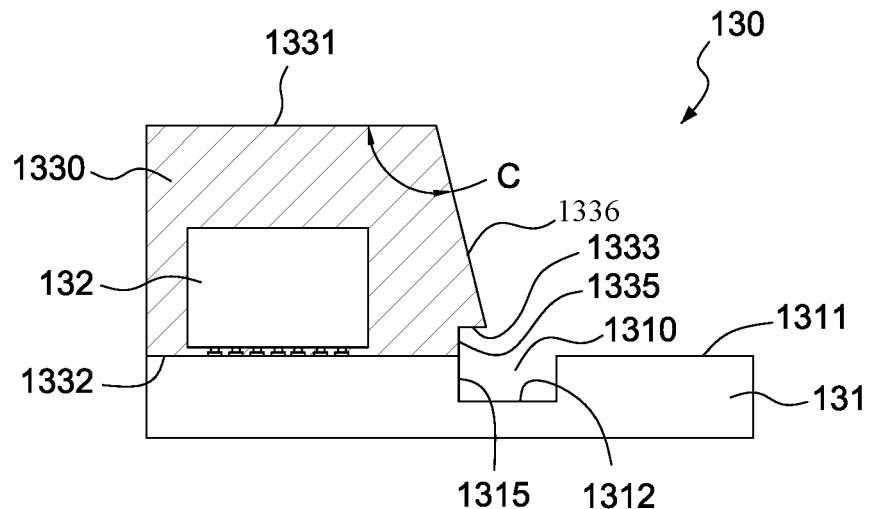

With reference to FIG. 4E, the removable/sacrificial layer 1317 is removed by physical methods or chemical methods, such as a water washing process. Further, the portion of the encapsulating material 1339 attached to the removable/sacrificial layer 1317 is removed (e.g. while removing the removable/sacrificial layer 1317). After removing the removable/sacrificial layer 1317 and the portion of the encapsulating material 1339, the portion of the encapsulating material 1330 remains on the carrier 131 and a portion of the upper surface 1311 and the recessed surface 1312 of the carrier 131 are exposed. The portion of the encapsulating material 1330 is disposed on the upper surface 1311 of the carrier 131. The portion of the encapsulating material 1330 has an upper surface 1331 and a lower surface 1332 which is opposite to the upper surface 1131. In addition, the portion of the encapsulating material 1330 further has a surface 1333 at a height between that of the upper surface 1331 and the lower surface 1332, wherein the surface 1333 is spaced from and disposed over the recessed surface 1312 of the carrier 131. There is a space between the surface 1333 and the recessed surface 1312. Moreover, the portion of the encapsulating material 1330 has a side surface 1335, which is connected to the lower surface 1332 and the surface 1333. The side surface 1335 is substantially coplanar with the side surface 1313 of the recess 1310.

Moreover, the portion of the encapsulating material 1330 has a side surface 1336. An angle C between the side surface 1336 and the upper surface 1331 ranges from about 90 degrees to about 110 degrees.

Figure 5A:
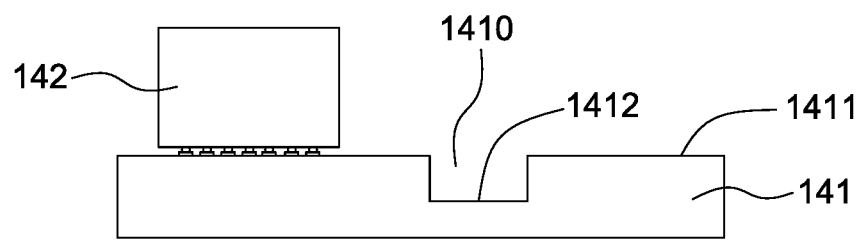
FIG. 5A, FIG. 5B, FIG. 5C, FIG. 5D and FIG. 5E show a method of manufacturing a semiconductor device package in accordance with another embodiment of the instant disclosure.

FIG. 5A, FIG. 5B, FIG. 5C, FIG. 5D and FIG. 5E show a method of manufacturing a semiconductor device package 140 in accordance with another embodiment of the instant disclosure. As shown in FIG. 5A, a carrier 141 has an upper surface 1411 and a recess 1410 formed in the upper surface 1411. The carrier 141 further has a recessed surface 1412 (e.g. that defines a bottom of the recess 1410) recessed with respect to the upper surface 1411. At least one electronic component 142 is disposed on the upper surface 1411 of the carrier 141.

Figure 5B:
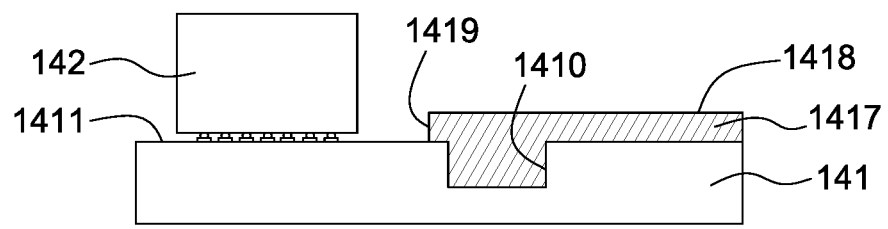

Further, with reference to FIG. 5B, a glue is dispensed on the upper surface 1411 of the carrier 141, wherein a portion of the glue flows into the recess 1410. Thus, a removable/sacrificial layer 1417 is formed on the upper surface 1411 and the recessed surface 1412 of the carrier 141. The removable/sacrificial layer 1417 has an upper surface 1418 higher than the upper surface 1411 of the carrier 141. Moreover, since the glue overflows the recess 1410, the removable/sacrificial layer 1417 extends across the recess 1410 and has a side surface 1419 on the upper surface 1411 of the carrier 141.

Figure 5C:
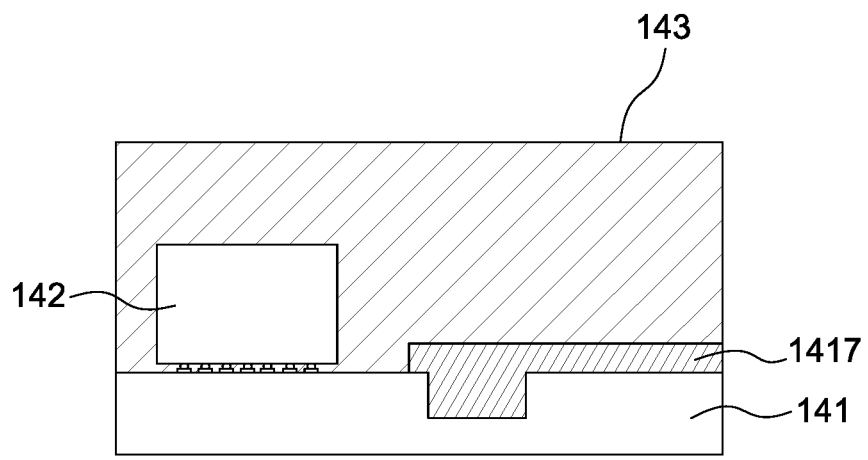

With reference to FIG. 5C, an encapsulating material 143 is disposed on the carrier 141 and encapsulates the at least one electronic component 142 and the removable/sacrificial layer 1417. The encapsulating material 143 covers the at least one electronic component 142, the upper surface 1411 of the carrier 141 and the removable/sacrificial layer 1417.

Figure 5D:
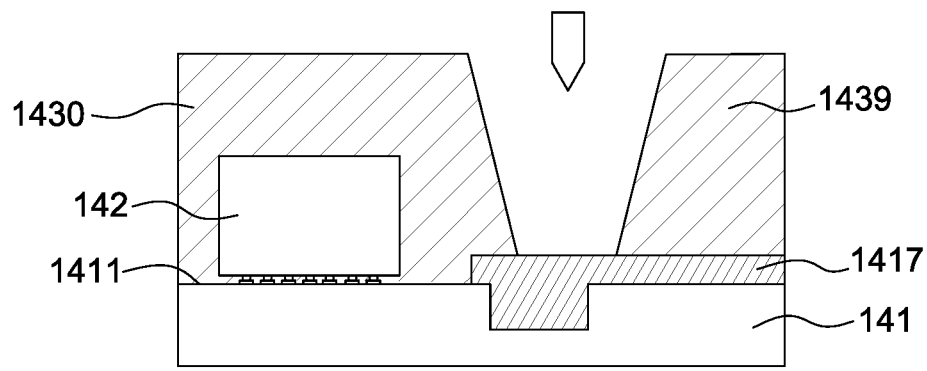

With reference to FIG. 5D, a portion of the encapsulating material 143 is removed by a laser process and thus a portion of the removable/sacrificial layer 1417 is exposed. Thereby, the encapsulating material 143 is divided into two portions 1430 and 1439, wherein the portion of the encapsulating material 1430 is attached to the upper surface 1411 of the carrier 141 and the removable/sacrificial layer 1417 and the portion of the encapsulating material 1439 is attached to the removable/sacrificial layer 1417.

Figure 5E:
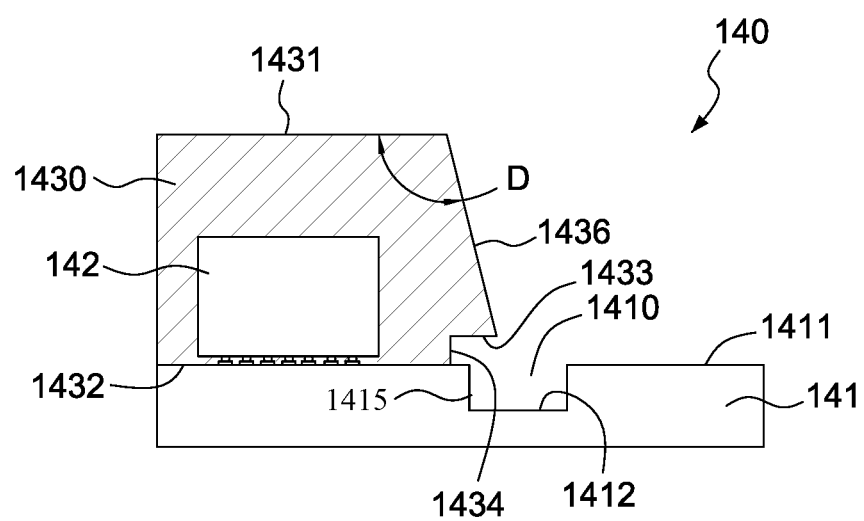

With reference to FIG. 5E, the removable/sacrificial layer 1417 is removed by physical methods or chemical methods, such as a water washing process. Further, the portion of the encapsulating material 1439 attached to the removable/sacrificial layer 1417 is removed (e.g. while removing the removable/sacrificial layer 1417). After removing the removable/sacrificial layer 1417 and the portion of the encapsulating material 1439, the portion of the encapsulating material 1430 remains on the carrier 141 and a portion of the upper surface 1411 and the recessed surface 1412 of the carrier 141 are exposed. The portion of the encapsulating material 1430 is disposed on the upper surface 1411 of the carrier 141. The portion of the encapsulating material 1430 has an upper surface 1431 and a lower surface 1432 which is opposite to the upper surface 1431. The portion of the encapsulating material 1430 further has a surface 1433 at a height between that of the upper surface 1431 and the lower surface 1432, wherein the surface 1433 is spaced from the upper surface 1411 and the recessed surface 1412 of the carrier 141. There is a space between the surface 1433 and the upper surface 1411 the recessed surface 1412. In addition, the portion of the encapsulating material 1430 further has a side surface 1434 which is connected to the lower surface 1432 and the surface 1433. The side surface 1434 is disposed on the upper surface 1411 of the carrier 141 and not coplanar with a side surface 1415 of the recess 1410. The side surface of the recess 1410 may be disposed under the surface 1433.

Moreover, the portion of the encapsulating material 1430 has a side surface 1436. An angle D between the side surface 1436 and the upper surface 1431 ranges from about 90 degrees to about 110 degrees.

Figure 6A:
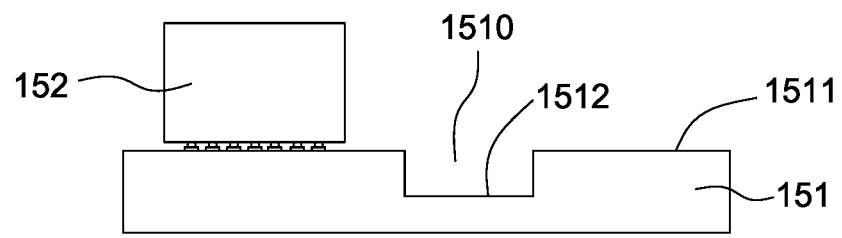
FIG. 6A, FIG. 6B, FIG. 6C, FIG. 6D and FIG. 6E show a method of manufacturing a semiconductor device package in accordance with another embodiment of the instant disclosure.

FIG. 6A, FIG. 6B, FIG. 6C, FIG. 6D and FIG. 6E show a method of manufacturing a semiconductor device package 150 in accordance with another embodiment of the instant disclosure. As shown in FIG. 6A, a carrier 151 has an upper surface 1511 and a recess 1510 formed in the upper surface 1511. The carrier 151 further has a recessed surface 1512 (e.g. that defines a bottom of the recess 1510) recessed with respect to the upper surface 1511. At least one electronic component 152 is disposed on the upper surface 1511 of the carrier 151.

Figure 6B:
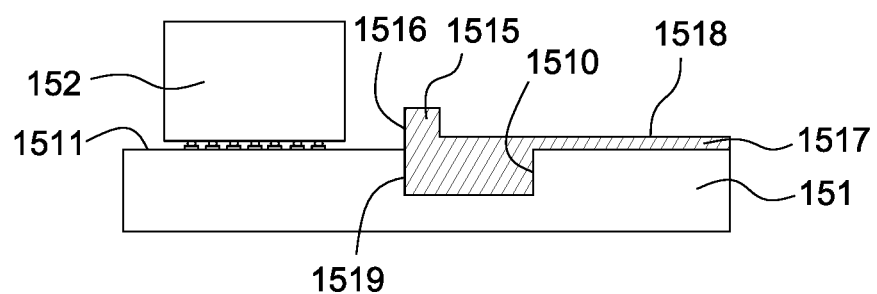

Further, with reference to FIG. 6B, a glue is dispensed on the upper surface 1511 of the carrier 151, wherein a portion of the glue flows into the recess 1510. Thus, a removable/sacrificial layer 1517 is formed on the upper surface 1511 and the recessed surface 1512 of the carrier 151. The removable/sacrificial layer 1517 has an upper surface 1518 higher than the upper surface 1511 of the carrier 151. Moreover, since the glue overflows the recess 1510, the removable/sacrificial layer 157 has a protrusion 1515 protruded from the upper surface 1518 of the removable/sacrificial layer 1517. The protrusion 1515 has a side surface 1516 substantially coplanar with the side surface 1519 of the recess 1510.

Figure 6C:
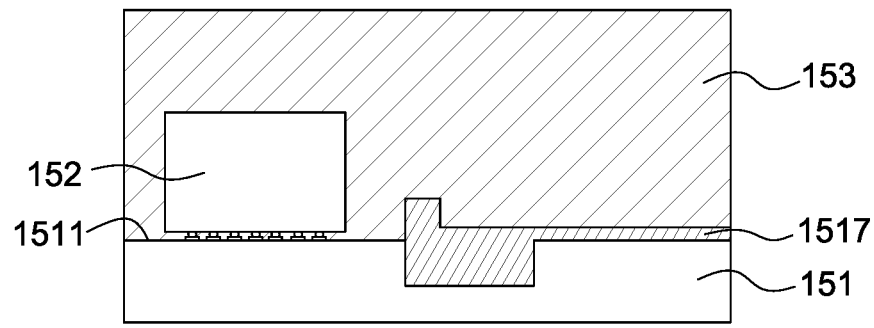

With reference to FIG. 6C, an encapsulating material 153 is disposed on the carrier 151 and encapsulates the at least one electronic component 152 and the removable/sacrificial layer 1517. The encapsulating material 153 covers the at least one electronic component 152, the upper surface 1511 of the carrier 151 and the removable/sacrificial layer 1517.

Figure 6D:
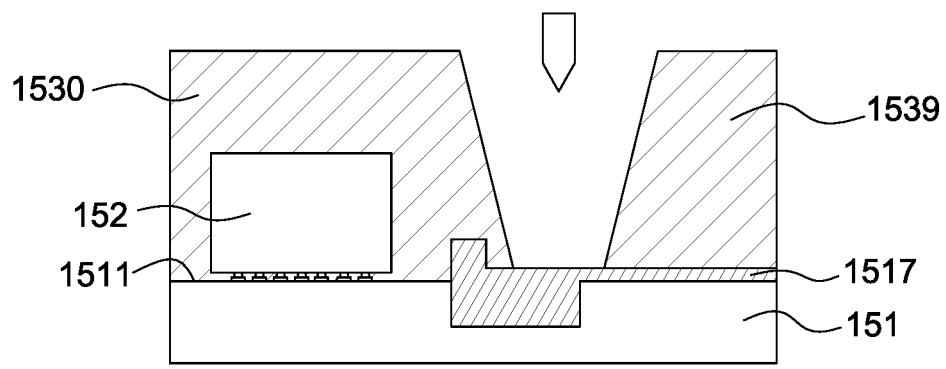

With reference to FIG. 6D, a portion of the encapsulating material 153 is removed by a laser process and thus a portion of the removable/sacrificial layer 1517 is exposed. Thereby, the encapsulating material 153 is divided into two portions 1530 and 1539, wherein the portion of the encapsulating material 1530 is attached to the upper surface 1511 of the carrier 151 and the removable/sacrificial layer 1517 and the portion of the encapsulating material 1539 is attached to the removable/sacrificial layer 1517.

Figure 6E:
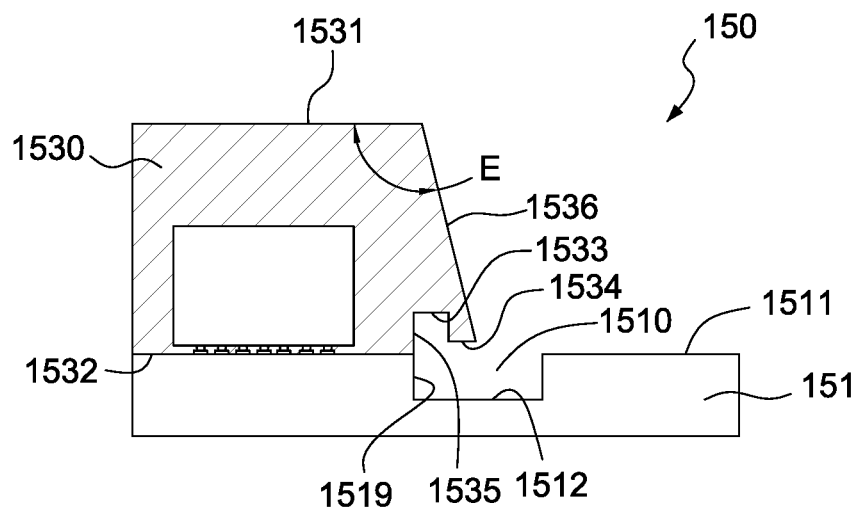

With reference to FIG. 6E, the removable/sacrificial layer 1517 is removed by physical methods or chemical methods, such as a water washing process. Further, the portion of the encapsulating material 1539 attached to the removable/sacrificial layer 1517 is removed (e.g. while removing the removable/sacrificial layer 1517). After removing the removable/sacrificial layer 1517 and the portion of the encapsulating material 1539, the portion of the encapsulating material 1530 remains on the carrier 151 and a portion of the upper surface 1511 and the recessed surface 1512 of the carrier 151 are exposed. The portion of the encapsulating material 1530 is disposed on the upper surface 1511 of the carrier 151. The portion of the encapsulating material 1530 has an upper surface 1531 and a lower surface 1532 which is opposite to the upper surface 1131. The portion of the encapsulating material 1530 further has a surface 1533 at a height between that of the upper surface 1531 and the lower surface 1532, wherein the surface 1533 is spaced from the upper surface 1511 and the recessed surface 1512 of the carrier 151. The surface 1533 is disposed over the recessed surface 1512 of the carrier 151. Moreover, the portion of the encapsulating material 1530 further has a surface 1534 which is adjacent to the surface 1533 and lower than the surface 1533. The surface 1534 is spaced from (and, for example, disposed over) the recessed surface 1512 of the carrier 151. The surface 1534 may be substantially parallel to the surface 1533. There is a space between the surfaces 1533, 1534 and the recessed surface 1512. In addition, the portion of the encapsulating material 1530 further has a side surface 1535 which is connected to the lower surface 1532 and the surface 1533. The side surface 1535 is substantially coplanar with the side surface 1519 of the recess 1510.

Moreover, the portion of the encapsulating material 1530 has a side surface 1536. An angle E between the side surface 1536 and the upper surface 1531 ranges from about 90 degrees to about 110 degrees.

Figure 7A:
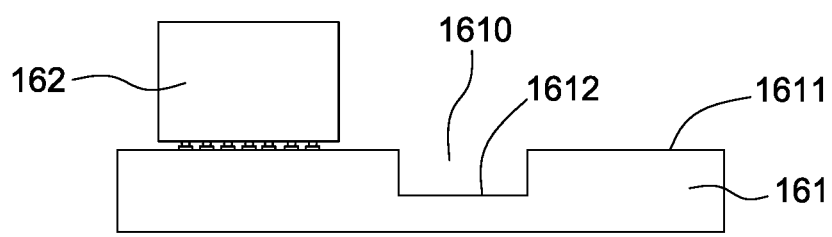
FIG. 7A, FIG. 7B, FIG. 7C, FIG. 7D and FIG. 7E show a method of manufacturing a semiconductor device package in accordance with another embodiment of the instant disclosure.

FIG. 7A, FIG. 7B, FIG. 7C, FIG. 7D and FIG. 7E show a method of manufacturing a semiconductor device package 160 in accordance with another embodiment of the instant disclosure. As shown in FIG. 7A, a carrier 161 has an upper surface 1611 and a recess 1610 formed in the upper surface 1611. The carrier 161 further has a recessed surface 1612 (e.g. that defines a bottom of the recess 1610) recessed with respect to the upper surface 1611. At least one electronic component 162 is disposed on the upper surface 1611 of the carrier 161.

Figure 7B:
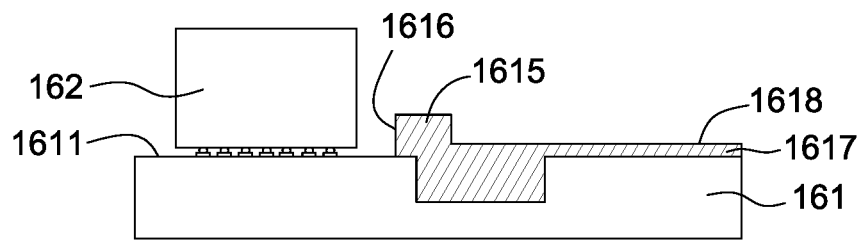

Further, with reference to FIG. 7B, a glue is dispensed on the upper surface 1611 of the carrier 161, wherein a portion of the glue flows into the recess 1610. Thus, a removable/sacrificial layer 1617 is formed on the upper surface 1611 and the recessed surface 1612 of the carrier 151. The removable/sacrificial layer 1617 has an upper surface 1618 higher than the upper surface 1611 of the carrier 161. Moreover, since the glue overflows the recess 1610, the removable/sacrificial layer 1617 has a protrusion 1615 protruded from the upper surface 1618 of the removable/sacrificial layer 1617 and extending to the upper surface 1611 of the carrier 161. The protrusion 1615 has a side surface 1616 disposed on the upper surface 1611 of the carrier 161.

Figure 7C:
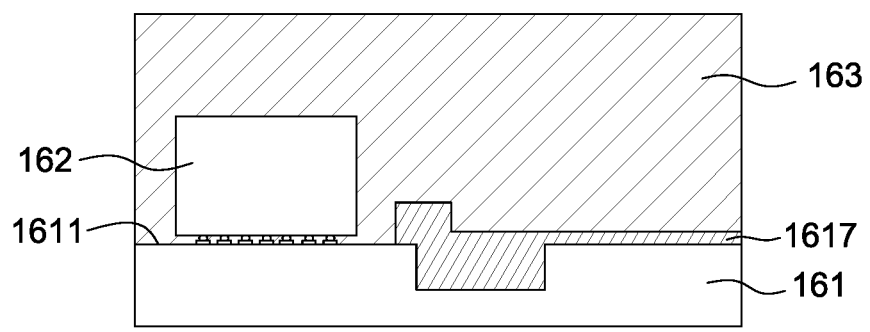

With reference to FIG. 7C, an encapsulating material 163 is disposed on the carrier 161 and encapsulates the at least one electronic component 162 and the removable/sacrificial layer 1617. The encapsulating material 163 covers the at least one electronic component 162, the upper surface 1611 of the carrier 161 and the removable/sacrificial layer 1617.

Figure 7D:
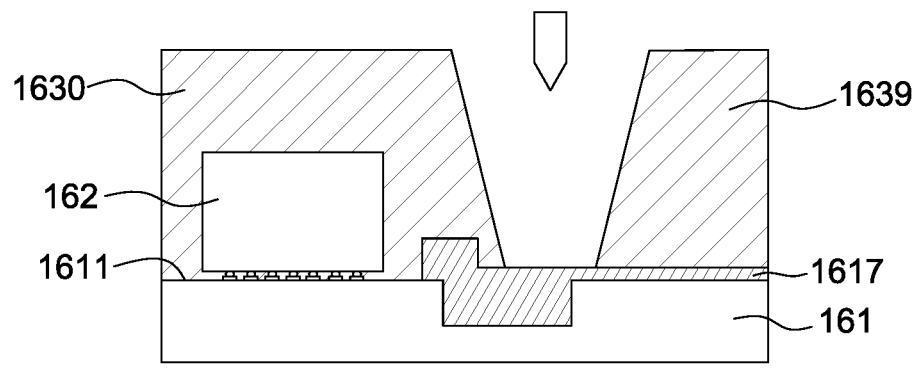

With reference to FIG. 7D, a portion of the encapsulating material 163 is removed by a laser process and thus a portion of the removable/sacrificial layer 1617 is exposed. Thereby, the encapsulating material 163 is divided into two portions 1630 and 1639, wherein the portion of the encapsulating material 1630 is attached to the upper surface 1611 of the carrier 161 and the removable/sacrificial layer 1617 and the portion of the encapsulating material 1639 is attached to the removable/sacrificial layer 1617.

Figure 7E:
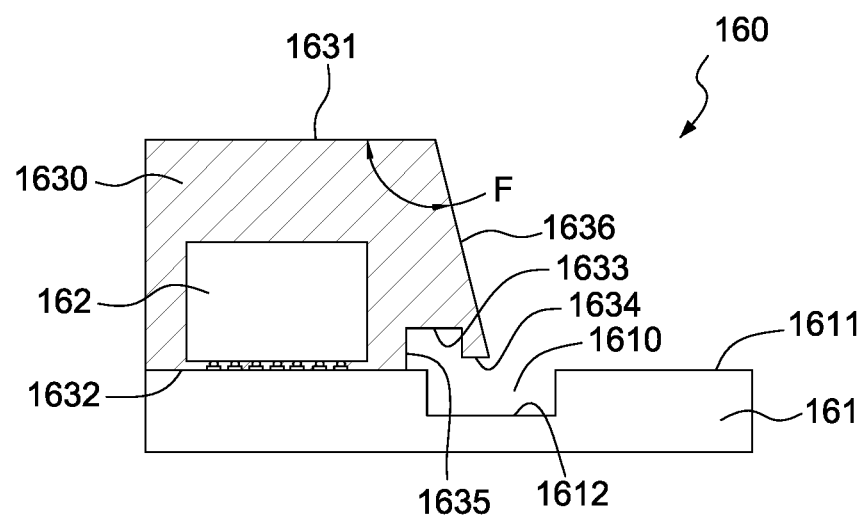

With reference to FIG. 7E, the removable/sacrificial layer 1617 is removed by physical methods or chemical methods, such as a water washing process. Further, the portion of the encapsulating material 1639 attached to the removable/sacrificial layer 1617 is removed (e.g. while removing the removable/sacrificial layer 1617). After removing the removable/sacrificial layer 1617 and the portion of the encapsulating material 1639, the portion of the encapsulating material 1630 remains on the carrier 161 and a portion of the upper surface 1611 and the recessed surface 1612 of the carrier 161 are exposed. The portion of the encapsulating material 1630 is disposed on the upper surface 1611 of the carrier 161. The portion of the encapsulating material 1630 has an upper surface 1631 and a lower surface 1632 which is opposite to the upper surface 1631. The portion of the encapsulating material 1630 further has a surface 1633 at a height between that of the upper surface 1631 and the lower surface 1632, wherein the surface 1633 is spaced from the upper surface 1611 and the recessed surface 1612 of the carrier 161. At least a portion of the surface 1633 is disposed over the recessed surface 1612 of the carrier 161. Moreover, the portion of the encapsulating material 1630 further has a surface 1634 which is adjacent to the surface 1633 and lower than the surface 1633. The surface 1634 is spaced from the recessed surface 1612 of the carrier 161. The surface 1634 may be substantially parallel to the surface 1633. There is a space between the surfaces 1633, 1634 and the upper and the recessed surfaces 1611, 1612. In addition, the portion of the encapsulating material 1630 further has a side surface 1635 which is connected to the lower surface 1632 and the surface 1633. The side surface 1635 is disposed on the upper surface 1611 of the carrier 161 and not coplanar with the side surface 1615 of the recess 1610.

Moreover, the portion of the encapsulating material 1630 has a side surface 1636. An angle F between the side surface 1636 and the upper surface 1631 ranges from about 90 degrees to about 110 degrees.

Figure 8A:
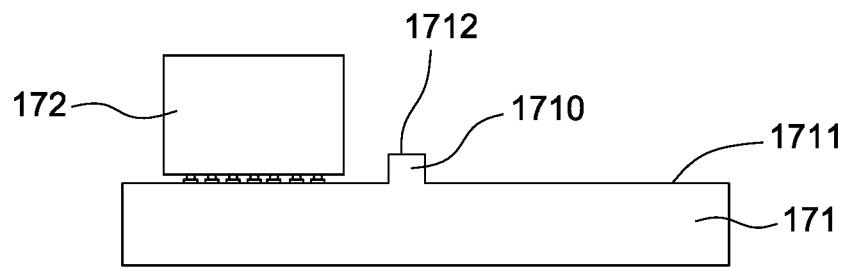
FIG. 8A, FIG. 8B, FIG. 8C, FIG. 8D and FIG. 8E show a method of manufacturing a semiconductor device package in accordance with another embodiment of the instant disclosure.

FIG. 8A, FIG. 8B, FIG. 8C, FIG. 8D and FIG. 8E show a method of manufacturing a semiconductor device package 170 in accordance with another embodiment of the instant disclosure. As shown in FIG. 8A, a carrier 171 has an upper surface 1711 and a protrusion 1710 formed on the upper surface 1711. The carrier 171 further has a protruded surface 1712 protruded with respect to the upper surface 1711. At least one electronic component 172 is disposed on the upper surface 1711 of the carrier 171.

Figure 8B:
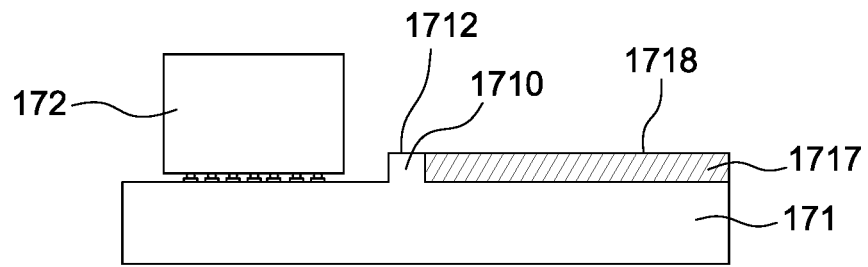

Further, with reference to FIG. 8B, a glue is dispensed on the upper surface 1711 of the carrier 171, wherein the glue does not flow across the protrusion 1710. Thus, a removable/sacrificial layer 1717 is formed on the upper surface 1711. Moreover, the removable/sacrificial layer 1717 has an upper surface 1718 substantially coplanar with the protruded surface 1712.

Figure 8C:
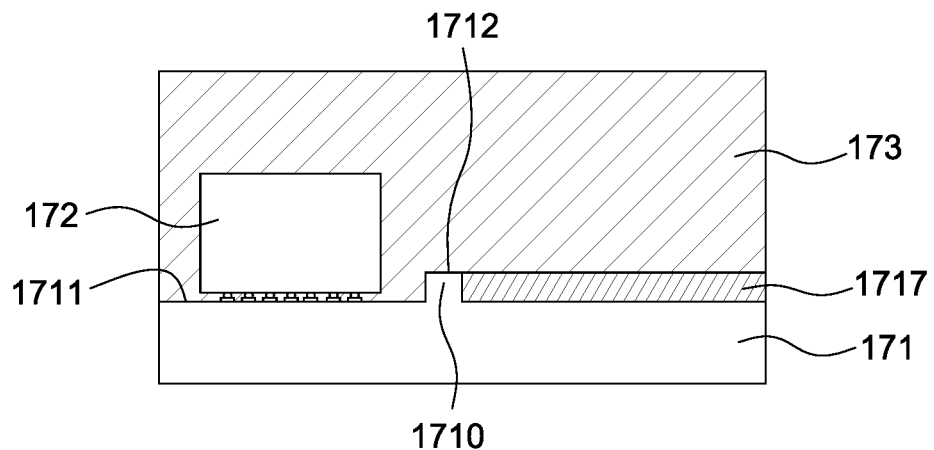

With reference to FIG. 8C, an encapsulating material 173 is disposed on the carrier 171 and encapsulates the at least one electronic component 172 and the removable/sacrificial layer 1717. The encapsulating material 173 covers at least one electronic component 172, the upper surface 1711 and the protruded surface 1712 of the carrier 171 and the removable/sacrificial layer 1717.

Figure 8D:
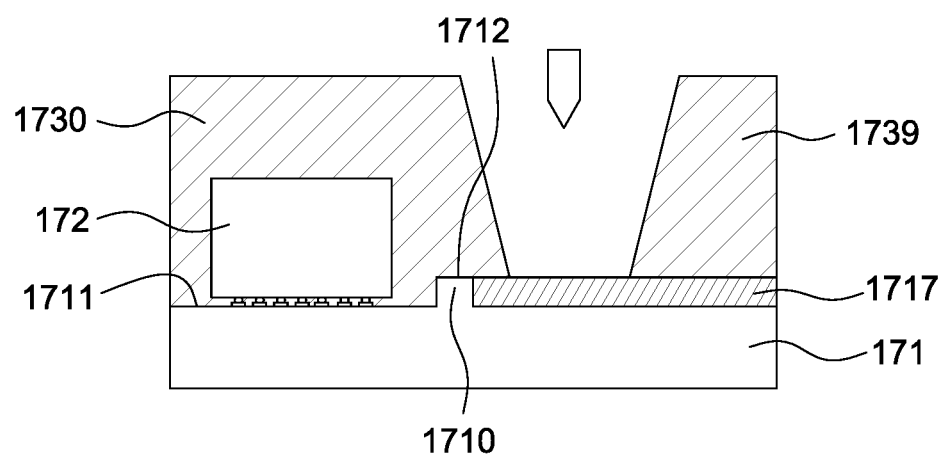

With reference to FIG. 8D, a portion of the encapsulating material 173 is removed by a laser process and thus a portion of the removable/sacrificial layer 1717 is exposed. Thereby, the encapsulating material 173 is divided into two portions 1730 and 1739, wherein the portion of the encapsulating material 1730 is attached to the upper surface 1711 and the protruded surface 1712 of the carrier 171 and the removable/sacrificial layer 1717 and the portion of the encapsulating material 1739 is attached to the removable/sacrificial layer 1717.

Figure 8E:
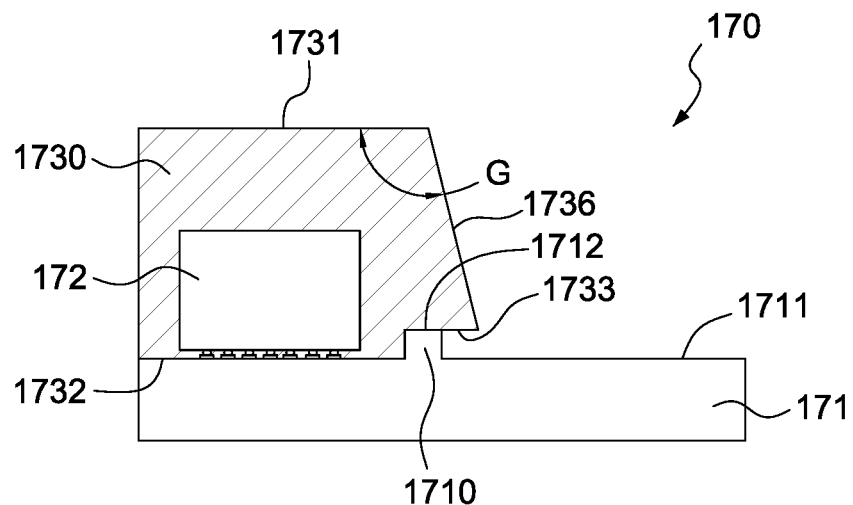

With reference to FIG. 8E, the removable/sacrificial layer 1717 is removed by physical methods or chemical methods, such as a water washing process. Further, the portion of the encapsulating material 1739 attached to the removable/sacrificial layer 1717 is removed (e.g. while removing the removable/sacrificial layer 1717). After removing the removable/sacrificial layer 1717 and the portion of the encapsulating material 1739, the portion of the encapsulating material 1730 remains on the carrier 171 and a portion of the upper surface 1711 of the carrier 171 is exposed. The portion of the encapsulating material 1730 is disposed on the upper surface 1711 of the carrier 171. The portion of the encapsulating material 1730 has an upper surface 1731 and a lower surface 1732 which is opposite to the upper surface 1731. In addition, the portion of the encapsulating material 1730 further has a surface 1733 at a height between that of the upper surface 1731 and the lower surface 1732, wherein a portion of the surface 1733 is attached to the protruded surface 1712 of the carrier 171 and a portion of the surface 1733 is spaced from the upper surface 1711 of the carrier 171. There is a space between the surface 1733 and the upper surface 1711.

Moreover, the portion of the encapsulating material 1730 has a side surface 1736. An angle G between the side surface 1736 and the upper surface 1731 ranges from about 90 degrees to about 110 degrees.

Figure 9A:
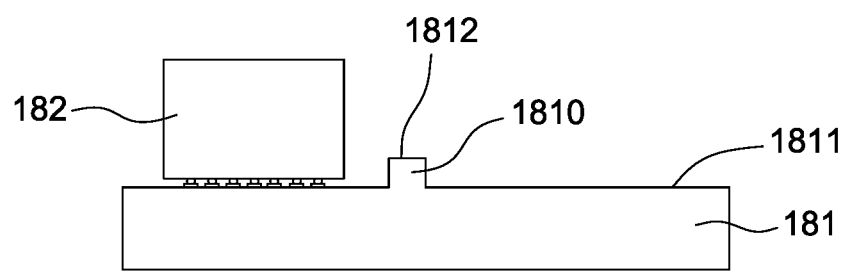
FIG. 9A, FIG. 9B, FIG. 9C, FIG. 9D and FIG. 9E show a method of manufacturing a semiconductor device package in accordance with another embodiment of the instant disclosure.

FIG. 9A, FIG. 9B, FIG. 9C, FIG. 9D and FIG. 9E show a method of manufacturing a semiconductor device package 180 in accordance with another embodiment of the instant disclosure. As shown in FIG. 9A, a carrier 181 has an upper surface 1811 and a protrusion 1810 formed on the upper surface 1811. The carrier 181 further has a protruded surface 1812 protruded with respect to the upper surface 1811. At least one electronic component 182 is disposed on the upper surface 1811 of the carrier 181.

Figure 9B:
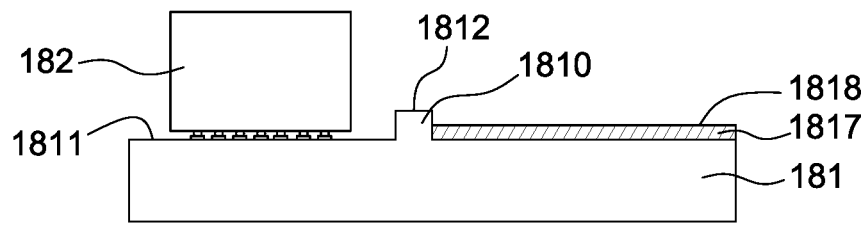

Further, with reference to FIG. 9B, a glue is dispensed on the upper surface 1811 of the carrier 181, wherein the glue does not flow across the protrusion 1810. Thus, a removable/sacrificial layer 1817 is formed on the upper surface 1811. Moreover, the removable/sacrificial layer 1817 has an upper surface 1818 lower than the protruded surface 1812.

Figure 9C:
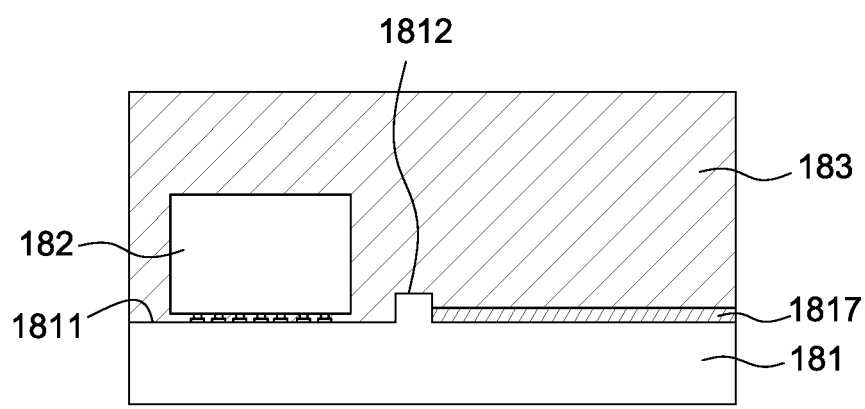

With reference to FIG. 9C, an encapsulating material 183 is disposed on the carrier 181 and encapsulates the at least one electronic component 182 and the removable/sacrificial layer 1817. The encapsulating material 183 covers at least one electronic component 182, the upper surface 1811 and the protruded surface 1812 of the carrier 181 and the removable/sacrificial layer 1817.

Figure 9D:
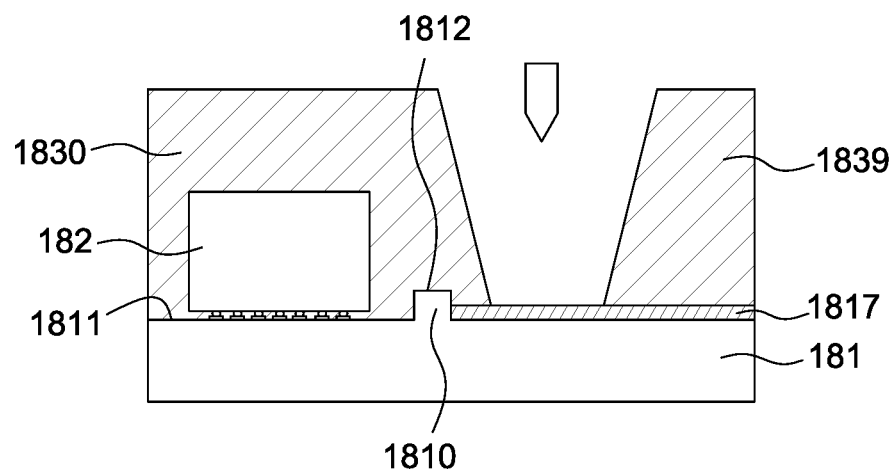

With reference to FIG. 9D, a portion of the encapsulating material 183 is removed by a laser process and thus a portion of the removable/sacrificial layer 1817 is exposed. Thereby, the encapsulating material 183 is divided into two portions 1830 and 1839, wherein the portion of the encapsulating material 1830 is attached to the upper surface 1811 and the protruded surface 1812 of the carrier 181 and the removable/sacrificial layer 1817 and the portion of the encapsulating material 1839 is attached to the removable/sacrificial layer 1817.

Figure 9E:
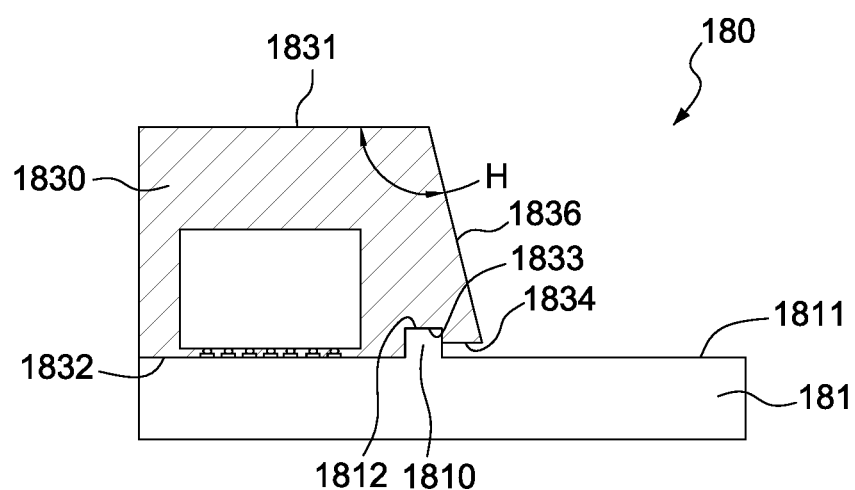

With reference to FIG. 9E, the removable/sacrificial layer 1817 is removed by physical methods or chemical methods, such as a water washing process. Further, the portion of the encapsulating material 1839 attached to the removable/sacrificial layer 1817 is removed (e.g. while removing the removable/sacrificial layer 1817). After removing the removable/sacrificial layer 1817 and the portion of the encapsulating material 1839, the portion of the encapsulating material 1830 remains on the carrier 181 and a portion of the upper surface 1811 of the carrier 181 is exposed. The portion of the encapsulating material 1830 is disposed on the upper surface 1811 of the carrier 181. The portion of the encapsulating material 1830 has an upper surface 1831 and a lower surface 1832 which is opposite to the upper surface 1831. In addition, the portion of the encapsulating material 1830 further has a surface 1833 at a height between that of the upper surface 1831 and the lower surface 1832, wherein the surface 1833 is attached to the protruded surface 1812 of the carrier 181. Moreover, the portion of the encapsulating material 1830 further has a surface 1834 which is adjacent to the surface 1833 and lower than the surface 1833. The surface 1834 may be substantially parallel to the surface 1833. The surface 1834 is spaced from the upper surface 1811 of the carrier 181. There is a space between the surface 1834 and the upper surface 1811.

Moreover, the portion of the encapsulating material 1830 has a side surface 1836. An angle H between the side surface 1836 and the upper surface 1831 ranges from about 90 degrees to about 110 degrees.

Figure 10A:
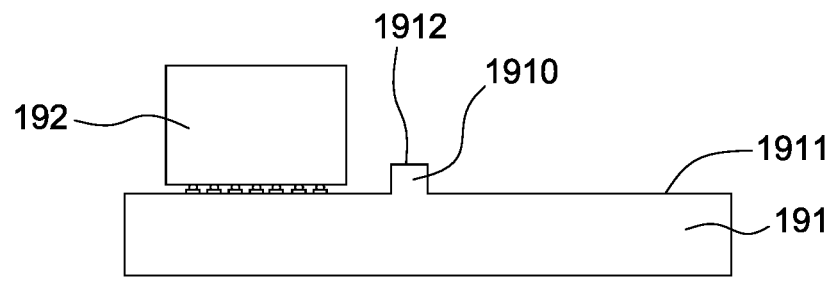
FIG. 10A, FIG. 10B, FIG. 10C, FIG. 10D and FIG. 10E show a method of manufacturing a semiconductor device package in accordance with another embodiment of the instant disclosure.

FIG. 10A, FIG. 10B, FIG. 10C, FIG. 10D and FIG. 10E show a method of manufacturing a semiconductor device package 190 in accordance with another embodiment of the instant disclosure. As shown in FIG. 10A, a carrier 191 has an upper surface 1911 and a protrusion 1910 formed on the upper surface 1911. The carrier 191 further has a protruded surface 1912 protruded with respect to the upper surface 1911. At least one electronic component 192 is disposed on the upper surface 1911 of the carrier 191.

Figure 10B:
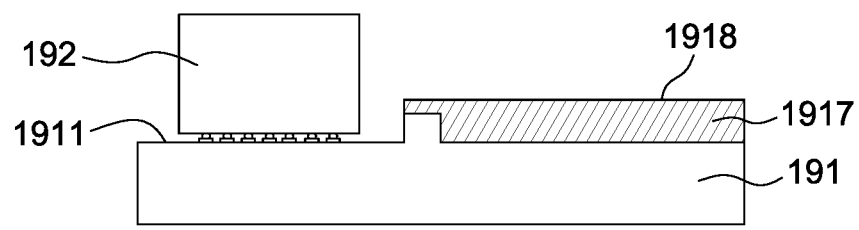

Further, with reference to FIG. 10B, a glue is dispensed on the upper surface 1911 of the carrier 191, wherein the glue extends on the protruded surface 1912 but does not flow across the protrusion 1910. Thus, a removable/sacrificial layer 1917 is formed on the upper surface 1911 and the protruded surface 1912. Moreover, the removable/sacrificial layer 1917 has a substantially flat upper surface 1918.

Figure 10C:
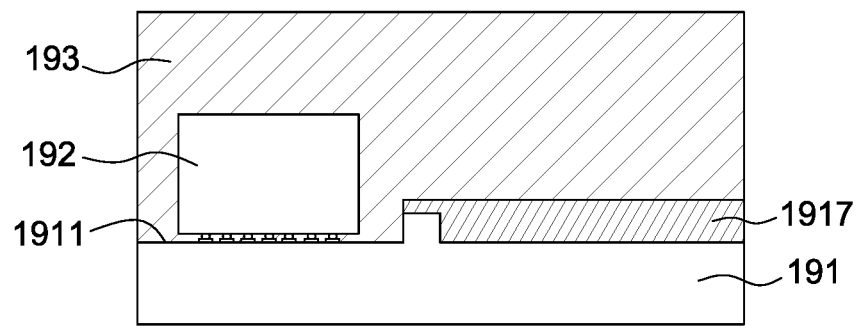

With reference to FIG. 10C, an encapsulating material 193 is disposed on the carrier 191 and encapsulates the at least one electronic component 192 and the removable/sacrificial layer 1917. The encapsulating material 193 covers at least one electronic component 192, the upper surface 1911 of the carrier 191 and the removable/sacrificial layer 1917.

Figure 10D:
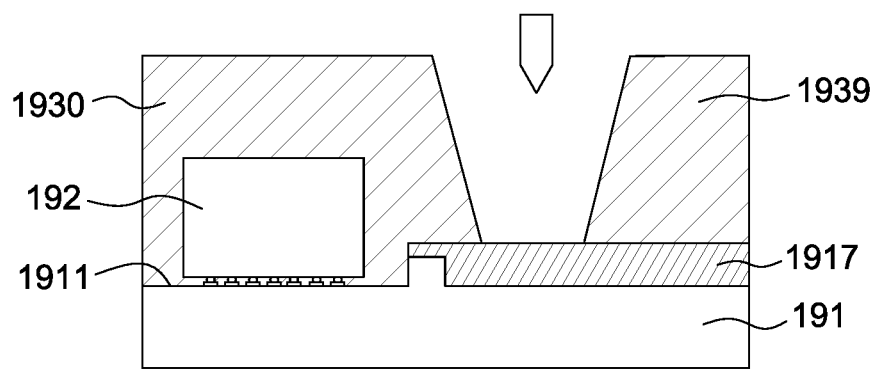

With reference to FIG. 10D, a portion of the encapsulating material 193 is removed by a laser process and thus a portion of the removable/sacrificial layer 1917 is exposed. Thereby, the encapsulating material 193 is divided into two portions 1930 and 1939, wherein the portion of the encapsulating material 1930 is attached to the upper surface 1911 of the carrier 191 and the removable/sacrificial layer 1917 and the portion of the encapsulating material 1939 is attached to the removable/sacrificial layer 1917.

Figure 10E:
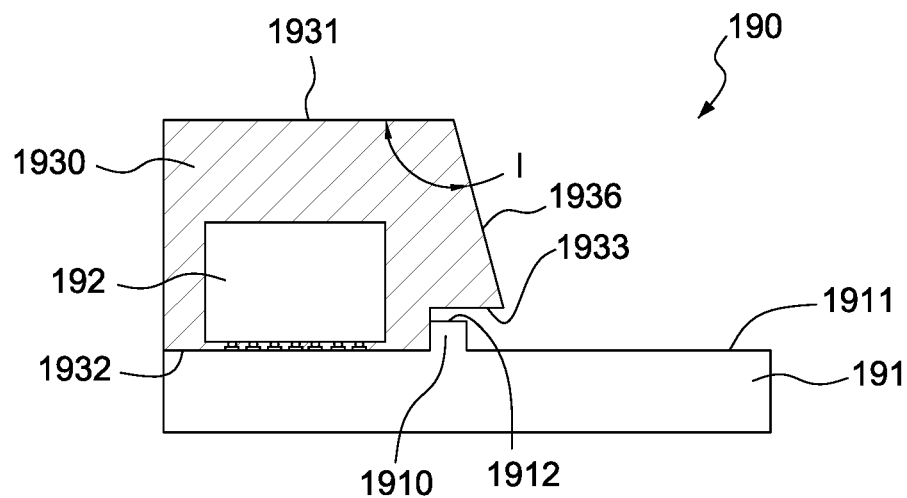

With reference to FIG. 10E, the removable/sacrificial layer 1917 is removed by physical methods or chemical methods, such as a water washing process. Further, the portion of the encapsulating material 1939 attached to the removable/sacrificial layer 1917 is removed (e.g. while removing the removable/sacrificial layer 1917). After removing the removable/sacrificial layer 1917 and the portion of the encapsulating material 1939, the portion of the encapsulating material 1930 remains on the carrier 191 and a portion of the upper surface 1911 of the carrier 191 is exposed. The portion of the encapsulating material 1930 is disposed on the upper surface 1911 of the carrier 191. The portion of the encapsulating material 1930 has an upper surface 1931 and a lower surface 1932 which is opposite to the upper surface 1931. In addition, the portion of the encapsulating material 1930 further has a surface 1933 at a height between that of the upper surface 1931 and the lower surface 1932, wherein the surface 1933 is spaced from the upper surface 1911 and the protruded surface 1912 of the carrier 191. There is a space between the surface 1933 and the upper surface 1911 and the protruded surface 1912. The surface 1933 may be disposed above the protruded surface 1912.

Moreover, the portion of the encapsulating material 1930 has a side surface 1936. An angle I between the side surface 1936 and the upper surface 1931 ranges from about 90 degrees to about 110 degrees.

Figure 11A:
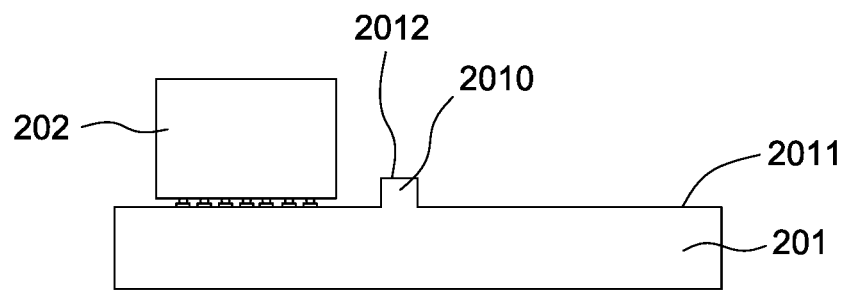
FIG. 11A, FIG. 11B, FIG. 11C, FIG. 11D and FIG. 11E show a method of manufacturing a semiconductor device package in accordance with another embodiment of the instant disclosure.

FIG. 11A, FIG. 11B, FIG. 11C, FIG. 11D and FIG. 11E show a method of manufacturing a semiconductor device package 200 in accordance with another embodiment of the instant disclosure. As shown in FIG. 11A, a carrier 201 has an upper surface 2011 and a protrusion 2010 formed on the upper surface 2011. The carrier 201 further has a protruded surface 2012 protruded with respect to the upper surface 2011. At least one electronic component 202 is disposed on the upper surface 2011 of the carrier 201.

Figure 11B:
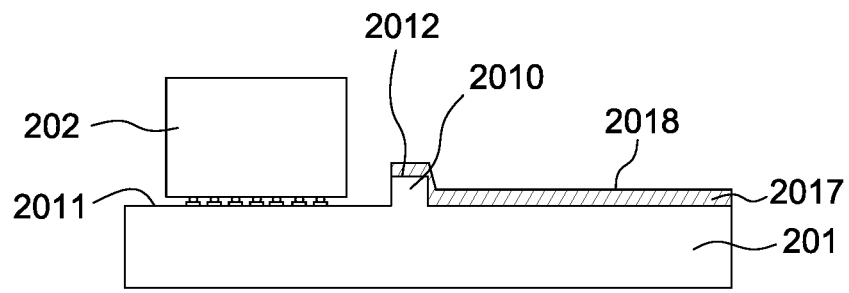

Further, with reference to FIG. 11B, a glue is dispensed on the upper surface 2011 of the carrier 201, wherein the glue extends on the protruded surface 2012 but does not flow across the protrusion 2010. Thus, a removable/sacrificial layer 2017 is formed on the upper surface 2011 and the protruded surface 2012. Moreover, the removable/sacrificial layer 2017 has an uneven upper surface 2018.

Figure 11C:
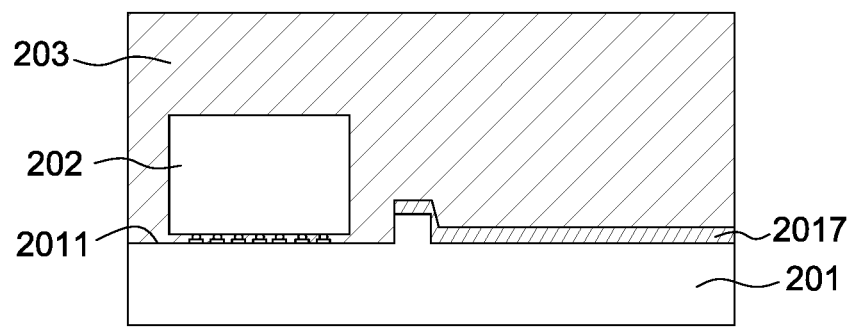

With reference to FIG. 11C, an encapsulating material 203 is disposed on the carrier 201 and encapsulates the at least one electronic component 202 and the removable/sacrificial layer 2017. The encapsulating material 203 covers at least one electronic component 202, the upper surface 2011 of the carrier 201 and the removable/sacrificial layer 2017.

Figure 11D:
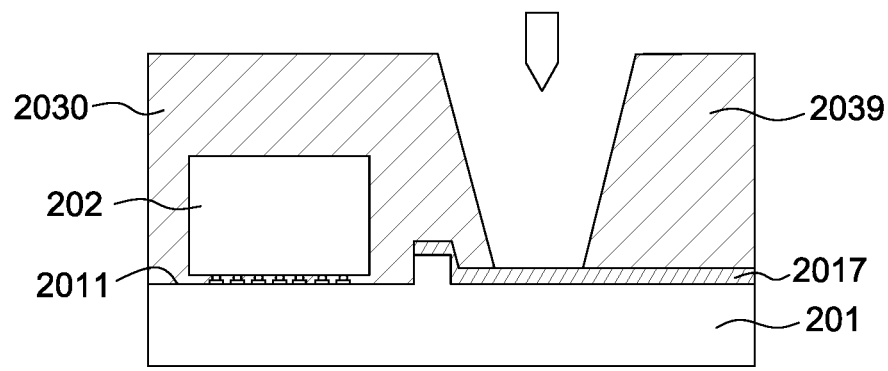

With reference to FIG. 11D, a portion of the encapsulating material 203 is removed by a laser process and thus a portion of the removable/sacrificial layer 2017 is exposed. Thereby, the encapsulating material 203 is divided into two portions 2030 and 2039, wherein the portion of the encapsulating material 2030 is attached to the upper surface 2011 of the carrier 201 and the removable/sacrificial layer 2017 and the portion of the encapsulating material 2039 is attached to the removable/sacrificial layer 2017.

Figure 11E:
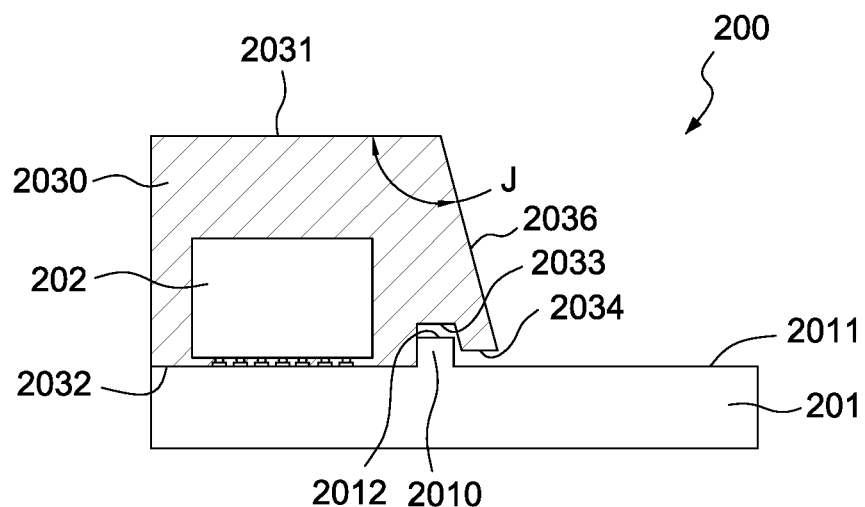

With reference to FIG. 11E, the removable/sacrificial layer 2017 is removed by physical methods or chemical methods, such as a water washing process. Further, the portion of the encapsulating material 2039 attached to the removable/sacrificial layer 2017 is removed (e.g. while removing the removable/sacrificial layer 2017). After removing the removable/sacrificial layer 2017 and the portion of the encapsulating material 2039, the portion of the encapsulating material 2030 remains on the carrier 201 and a portion of the upper surface 2011 of the carrier 201 is exposed. The portion of the encapsulating material 2030 is disposed on the upper surface 2011 of the carrier 201. The portion of the encapsulating material 2030 has an upper surface 2031 and a lower surface 2032 which is opposite to the upper surface 2031. In addition, the portion of the encapsulating material 2030 further has a surface 2033 at a height between that of the upper surface 2031 and the lower surface 2032. The surface 2033 is spaced from (and, for example, disposed over) the protruded surface 2012 of the carrier 201. Moreover, the portion of the encapsulating material 2030 further has a surface 2034 which is adjacent to the surface 2033 and lower than the surface 2033. The surface 2034 may be substantially parallel to the surface 2033. The surface 2034 is spaced from the upper surface 2011 of the carrier 201. There is a space between the surfaces 2033, 2034 and the upper and protruded surfaces 2011, 2012.

Moreover, the portion of the encapsulating material 2030 has a side surface 2036. An angle J between the side surface 2036 and the upper surface 2031 ranges from about 90 degrees to about 110 degrees.

Figure 12A:
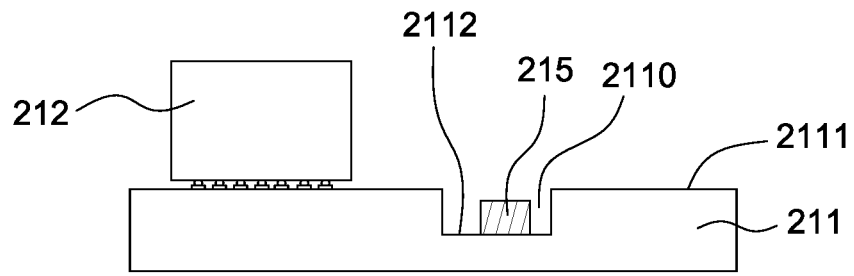
FIG. 12A, FIG. 12B, FIG. 12C, FIG. 12D, FIG. 12E and FIG. 12F show a method of manufacturing a semiconductor device package in accordance with another embodiment of the instant disclosure.

FIG. 12A, FIG. 12B, FIG. 12C, FIG. 12D, FIG. 12E and FIG. 12F show a method of manufacturing a semiconductor device package 210 in accordance with another embodiment of the instant disclosure. As shown in FIG. 12A, a carrier 211 has an upper surface 2111 and a recess 2110 formed in the upper surface 2111. The carrier 211 further has a recessed surface 2112 (e.g. that defines a bottom of the recess 2110) recessed with respect to the upper surface 2110. At least one electronic component 212 is disposed on the upper surface 2111 of the carrier 211. Further, a conductive layer 215 is disposed on the recessed surface 2112.

Figure 12B:
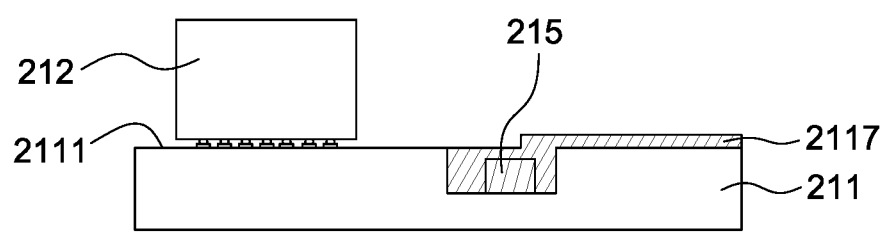

Further, with reference to FIG. 12B, a glue is dispensed on the upper surface 2111 of the carrier 211, wherein a portion of the glue flows into the recess 2110. Thus, a removable/sacrificial layer 2117 is formed on the upper surface 2111 and the recessed surface 2112 of the carrier 211 and the conductive layer 215.

Figure 12C:
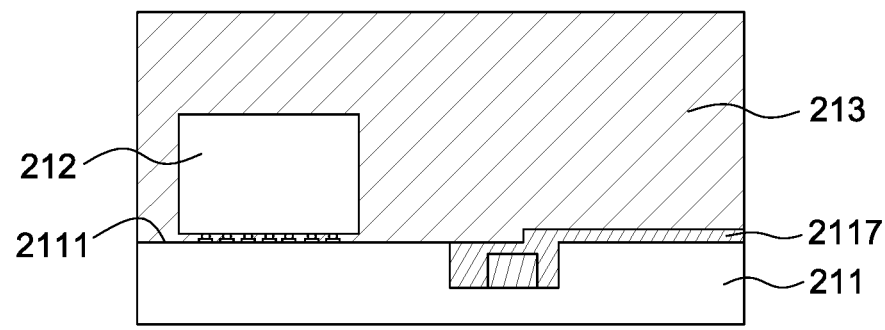

With reference to FIG. 12C, an encapsulating material 213 is disposed on the carrier 211 and encapsulates the at least one electronic component 212 and the removable/sacrificial layer 2117. The encapsulating material 213 covers the at least one electronic component 212, the upper surface 2111 of the carrier 211 and the removable/sacrificial layer 2117.

Figure 12D:
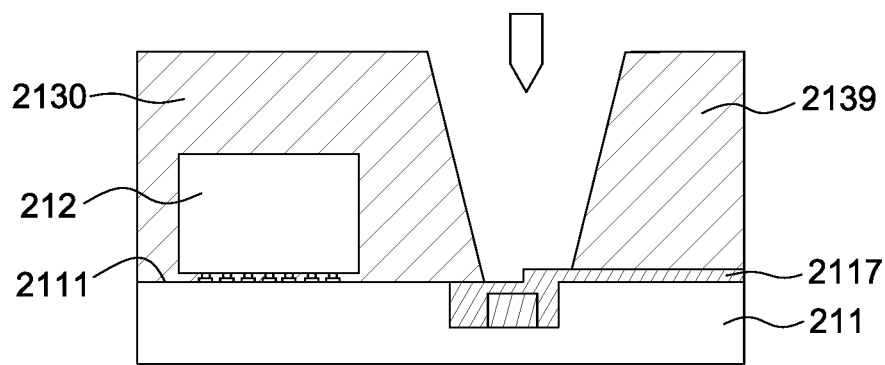

With reference to FIG. 12D, a portion of the encapsulating material 213 is removed by a laser process and thus a portion of the removable/sacrificial layer 2117 is exposed. The cutting gap formed by the laser substantially aligns with the position of the conductive layer 215. The encapsulating material 213 is divided into two portions 2130 and 2139, wherein the portion of the encapsulating material 2130 is attached to the upper surface 2111 of the carrier 211 and the removable/sacrificial layer 2117 and the portion of the encapsulating material 2139 is attached to the removable/sacrificial layer 2117.

Figure 12E:
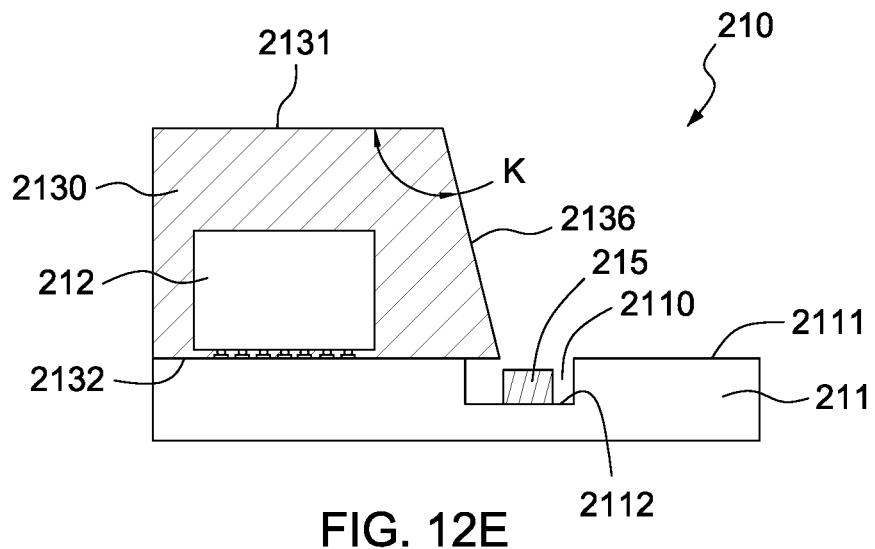

With reference to FIG. 12E, the removable/sacrificial layer 2117 is removed by physical methods or chemical methods, such as a water washing process. Further, the portion of the encapsulating material 2139 attached to the removable/sacrificial layer 2117 is removed (e.g. while removing the removable/sacrificial layer 2117). After removing the removable/sacrificial layer 2117 and the portion of the encapsulating material 2139, the portion of the encapsulating material 2130 remains on the carrier 211 and a portion of the upper surface 2111 and the recessed surface 2112 of the carrier 211 and the conductive layer 215 are exposed. The portion of the encapsulating material 2130 is disposed on the upper surface 2111 of the carrier 211. The portion of the encapsulating material 2130 has an upper surface 2131 and a lower surface 2132 which is opposite to the upper surface 2131. Further, a portion of the lower surface 2132 is spaced from (and, for example, disposed over) the recessed surface 2112 of the carrier 211 and a portion of the lower surface 2132 is attached to the upper surface 2111 of the carrier 211. There is a space between the lower surface 2132 and the recessed surface 2112.

Moreover, the portion of the encapsulating material 2130 has a side surface 2136. An angle K between the side surface 2136 and the upper surface 2131 ranges from about 90 degrees to about 110 degrees.

Figure 12F:
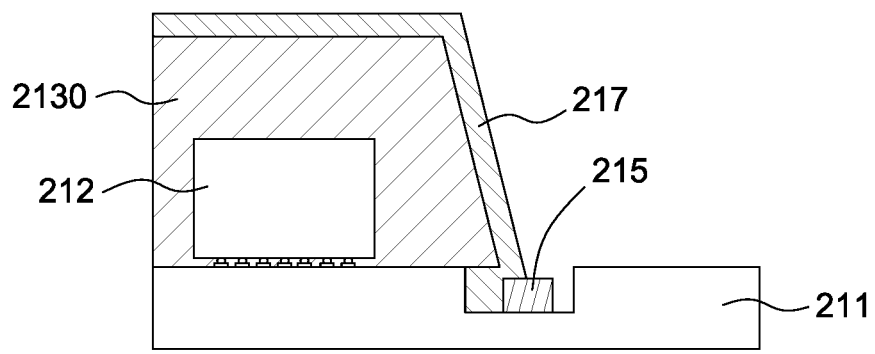

With reference to FIG. 12F, a shield layer 217 is formed on the conductive layer 215 and the portion of the encapsulating material 2130.

Figure 13A:
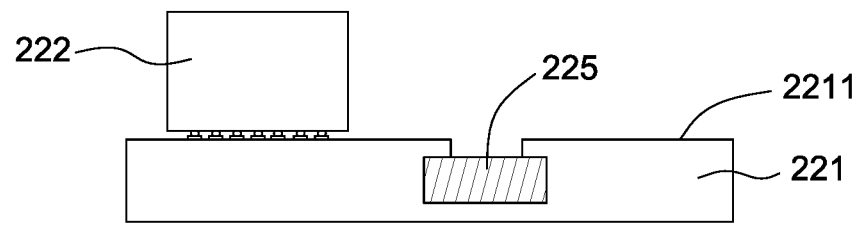
FIG. 13A, FIG. 13B, FIG. 13C, FIG. 13D, FIG. 13E and FIG. 13F show a method of manufacturing a semiconductor device package in accordance with another embodiment of the instant disclosure.

FIG. 13A, FIG. 13B, FIG. 13C, FIG. 13D, FIG. 13E and FIG. 13F show a method of manufacturing a semiconductor device package 220 in accordance with another embodiment of the instant disclosure. As shown in FIG. 13A, a carrier 221 has an upper surface 2211 and a conductive layer 225. A portion of the top surface of the conductive layer 255 is exposed and recessed with respect to the upper surface 2211 of the carrier 221.

Figure 13B:
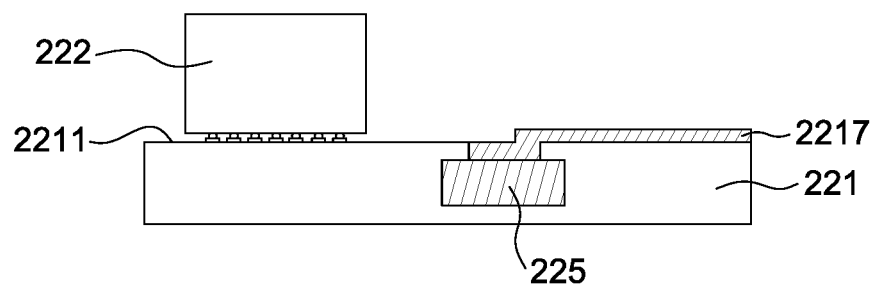

Further, with reference to FIG. 13B, a glue is dispensed on the upper surface 2211 of the carrier 211 and the conductive layer 225. Thus, a removable/sacrificial layer 2217 is formed on the upper surface 2211 and the carrier 221 and the conductive layer 225.

Figure 13C:
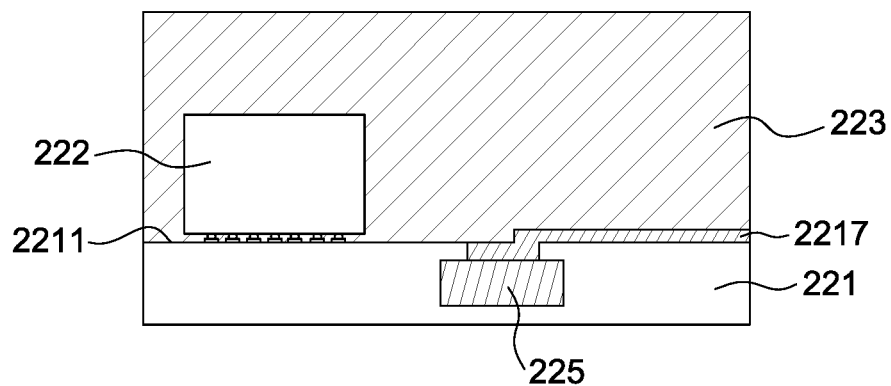

With reference to FIG. 13C, an encapsulating material 223 is disposed on the carrier 221 and encapsulates the at least one electronic component 222 and the removable/sacrificial layer 2217. The encapsulating material 223 covers the at least one electronic component 222, the upper surface 2211 of the carrier 221 and the removable/sacrificial layer 2217.

Figure 13D:
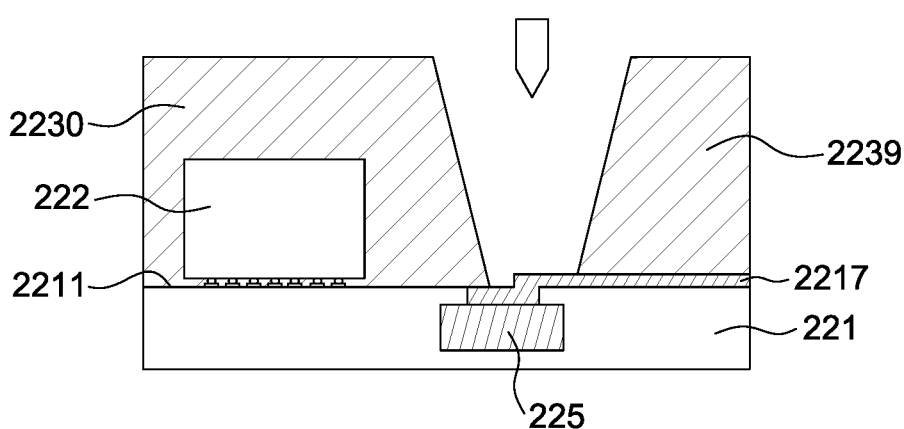

With reference to FIG. 13D, a portion of the encapsulating material 223 is removed by a laser process and thus a portion of the removable/sacrificial layer 2217 is exposed. The cutting gap formed by the laser substantially aligns with the position of the conductive layer 225. The encapsulating material 223 is divided into two portions 2230 and 2239, wherein the portion of the encapsulating material 2230 is attached to the upper surface 2211 of the carrier 221 and the removable/sacrificial layer 2217 and the portion of the encapsulating material 2239 is attached to the removable/sacrificial layer 2217.

Figure 13E:
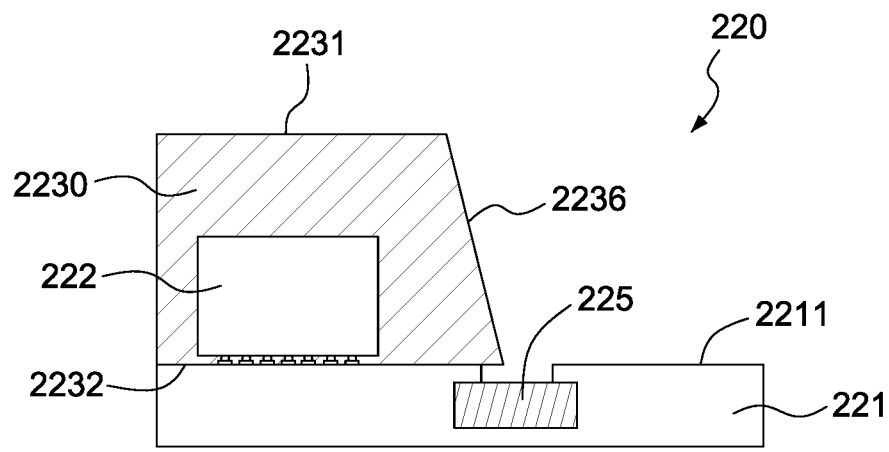

With reference to FIG. 13E, the removable/sacrificial layer 2217 is removed by physical methods or chemical methods, such as a water washing process. Further, the portion of the encapsulating material 2239 attached to the removable/sacrificial layer 2217 is removed (e.g. while removing the removable/sacrificial layer 2217). After removing the removable/sacrificial layer 2217 and the portion of the encapsulating material 2239, the portion of the encapsulating material 2230 remains on the carrier 221 and a portion of the upper surface 2211 the carrier 211 and the conductive layer 225 are exposed. The portion of the encapsulating material 2230 is disposed on the upper surface 2211 of the carrier 221. The portion of the encapsulating material 2230 has an upper surface 2231 and a lower surface 2232 which is opposite to the upper surface 2231. Further, a portion of the lower surface 2232 is spaced from the conductive layer 225 and a portion of the lower surface 2232 is attached to the upper surface 2211 of the carrier 221. There is a space between the lower surface 2232 and the conductive layer 225.

Moreover, the portion of the encapsulating material 2230 has a side surface 2236. An angle L between the side surface 2236 and the upper surface 2231 ranges from about 90 degrees to about 110 degrees.

Figure 13F:
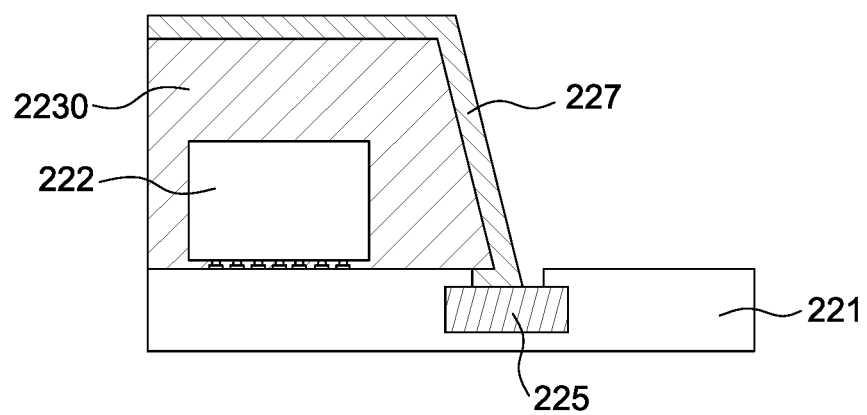

With reference to FIG. 13F, a shield layer 227 is formed on the conductive layer 225 and the portion of the encapsulating material 2230.

Figure 14A:
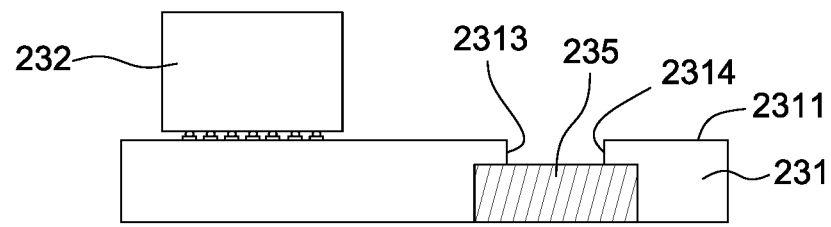
FIG. 14A, FIG. 14B, FIG. 14C, FIG. 14D and FIG. 14E show a method of manufacturing a semiconductor device package in accordance with another embodiment of the instant disclosure.

FIG. 14A, FIG. 14B, FIG. 14C, FIG. 14D and FIG. 14E show a method of manufacturing a semiconductor device package 230 in accordance with another embodiment of the instant disclosure. As shown in FIG. 14A, a carrier 231 has an upper surface 2311 and includes a conductive layer 235. A portion of the top surface of the conductive layer 235 is exposed and recessed with respect to the upper surface 2311 of the carrier 231. Further, since the portion of the top surface of the conductive layer 235 is exposed and recessed with respect to the upper surface 2311 of the carrier 231, the carrier 231 further has side surfaces 2313, 2314 disposed on the conductive layer 225 and adjacent to and angled (e.g. at about 90 degrees) with respect to the upper surface 2311 of the carrier 231.

Figure 14B:
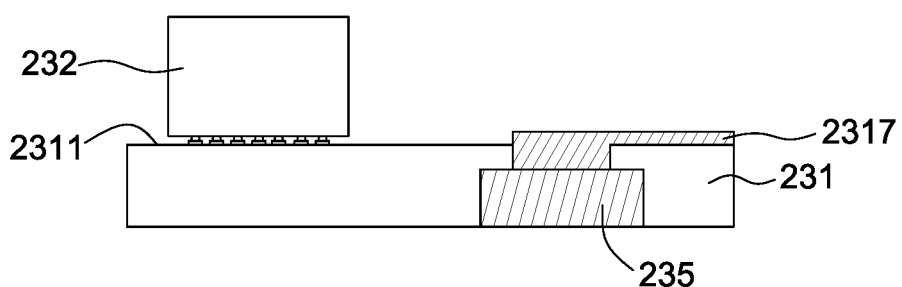

Further, with reference to FIG. 14B, a glue is dispensed on the upper surface 2311 of the carrier 231 and the conductive layer 235. Thus, a removable/sacrificial layer 2317 is formed on the upper surface 2311 and the carrier 231 and the conductive layer 235.

Figure 14C:
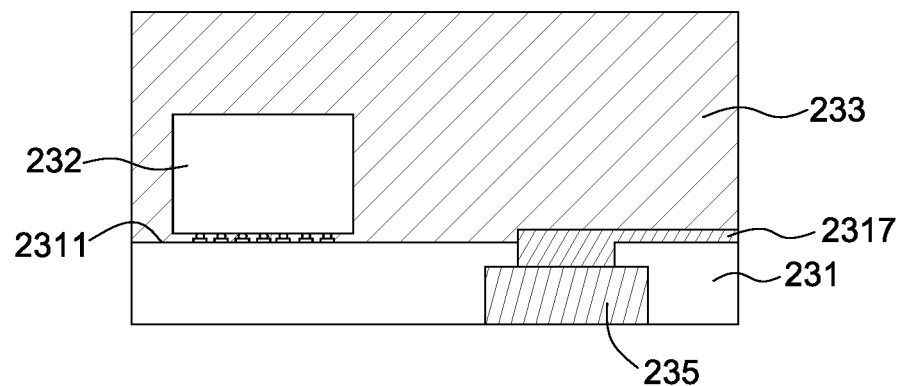

With reference to FIG. 14C, an encapsulating material 233 is disposed on the carrier 231 and encapsulates the at least one electronic component 232 and the removable/sacrificial layer 2317. The encapsulating material 233 covers the at least one electronic component 232, the upper surface 2311 of the carrier 231 and the removable/sacrificial layer 2317.

Figure 14D:
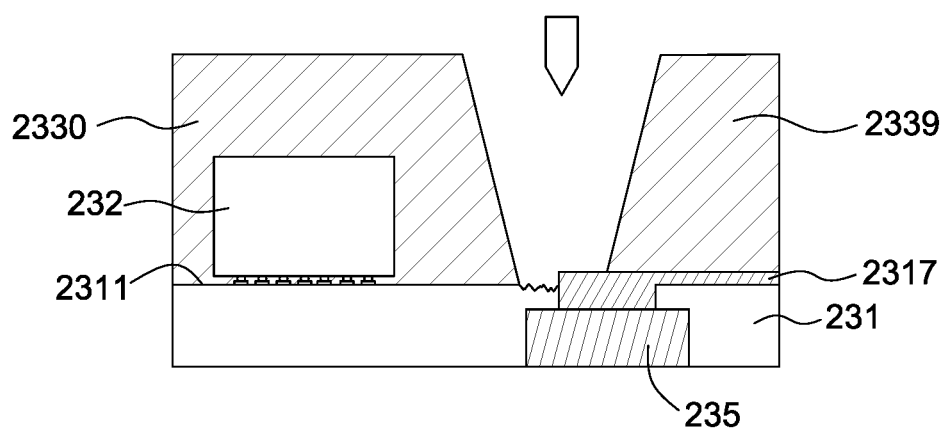

With reference to FIG. 14D, a portion of the encapsulating material 233 is removed by a laser process and thus a portion of the removable/sacrificial layer 2317 and a portion of the upper surface 2311 of the carrier 231 are exposed. Further, while using the laser to cut the encapsulating material 233, the laser contacts the portion of the removable/sacrificial layer 2317 and the portion of the upper surface 2311 of the carrier 231 which are exposed after the portion of the encapsulating material 233 has been removed. The portion of the upper surface 2311 of the carrier 231 contacted by the laser may be roughened by the laser. The encapsulating material 233 is divided into two portions 2330 and 2339, wherein the portion of the encapsulating material 2330 is attached to the upper surface 2311 of the carrier 231 and the portion of the encapsulating material 2339 is attached to the removable/sacrificial layer 2317.

Figure 14E:
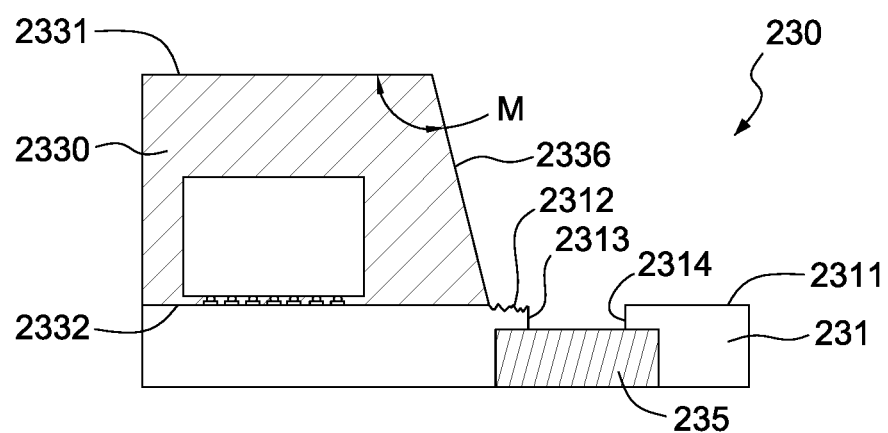

With reference to FIG. 14E, the removable/sacrificial layer 2317 is removed by physical methods or chemical methods, such as a water washing process. Further, the portion of the encapsulating material 2339 attached to the removable/sacrificial layer 2317 is removed (e.g. while removing the removable/sacrificial layer 2317). After removing the removable/sacrificial layer 2317 and the portion of the encapsulating material 2339, the portion of the encapsulating material 2330 remains on the carrier 231 and a portion of the upper surface 2311 the carrier 211 and the conductive layer 235 are exposed. As above mentioned, the laser directly contacts the portion of the upper surface 2311 while cutting the encapsulating material 233. Thus, a surface 2312 of the carrier 231, which is between the portion of the encapsulating material 2330 and the conductive layer 235, has a roughness greater than a roughness of another portion of the upper surface 2311 of the carrier 231 and greater than a roughness of the side surfaces 2313, 2314 of the carrier 231 (e.g., by a factor of about 1.3 or more, of about 1.5 or more, of about 2 or more, or greater).

Moreover, the portion of the encapsulating material 2330 has a side surface 2336. An angle M between the side surface 2336 and the upper surface 2331 ranges from about 90 degrees to about 110 degrees.

Reference to the formation or positioning of a first feature over or on a second feature in the instant disclosure may include embodiments in which the first and second features are formed or disposed in direct contact, and may also include embodiments in which additional features may be formed or disposed between the first and second features, such that the first and second features may not be in direct contact.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

For example, substantially parallel can refer to a range of angular variation relative to 0° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, substantially perpendicular can refer to a range of angular variation relative to 90° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the instant disclosure has been described and illustrated with reference to specific embodiments thereof, these descriptions and illustrations are not limiting. It should be understood by those skilled in the art that various changes may be made and equivalents may be substituted without departing from the true spirit and scope of the instant disclosure as defined by the appended claims. The illustrations may not be necessarily drawn to scale. There may be distinctions between the artistic renditions in the instant disclosure and the actual apparatus due to manufacturing processes and tolerances. There may be other embodiments of the instant disclosure which are not specifically illustrated. The specification and drawings are to be regarded as illustrative rather than restrictive. Modifications may be made to adapt a particular situation, material, composition of matter, method, or process to the objective, spirit and scope of the instant disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the instant disclosure. Accordingly, unless specifically indicated herein, the order and grouping of the operations are not limitations of the instant disclosure.

What is claimed is:

1. A method of manufacturing a semiconductor device package, comprising:
   providing a substrate with a recess and an electronic component, wherein the electronic component is disposed over the substrate and outside the recess;
   forming a sacrificial material over the recess of the substrate;
   encapsulating the substrate and the sacrificial material by an encapsulant;
   removing a portion of the encapsulant to expose the sacrificial material;
   removing the sacrificial material; and
   after removing the sacrificial material, forming a concave recessed from a lower surface of the encapsulant, wherein the concave is in communication with an outside of the semiconductor device package through the recess;
   wherein the concave horizontally overlaps the electronic component.

2. The method of claim 1, further comprising: exposing a first inclined lateral surface of the encapsulant after removing the portion of the encapsulant.

3. The method of claim 2, wherein the first inclined lateral surface vertically overlaps the recess.

4. The method of claim 2, further comprising: exposing a second inclined lateral surface of the encapsulant after removing the portion of the encapsulant; wherein an extending direction of the second inclined lateral surface is different from an extending direction of the first inclined lateral surface.

5. The method of claim 4, wherein a horizontal distance between the first inclined lateral surface and the second inclined lateral surface is tapered toward the substrate.

6. The method of claim 1, wherein a width of the recess is greater than a width of the concave.

7. The method of claim 1, further comprising: encapsulating the electronic component by the encapsulant while encapsulating the substrate and the sacrificial material by the encapsulant.

8. The method of claim 7, wherein the encapsulant comprises a first portion between the electronic component and the substrate.

9. The method of claim 8, wherein the encapsulant comprises a second portion over the electronic component, and wherein a thickness of the second portion of the encapsulant is greater than a thickness of the first portion of the encapsulant.

10. The method of claim 7, wherein the electronic component comprises a first side and a second side opposite to the first side, wherein the first side of the electronic component is closer to the recess than the second side of the electronic component is, wherein the encapsulant has a third portion adjacent to the first side of the electronic component and a fourth portion adjacent to the second side of the electronic component, wherein a width of the third portion of the encapsulant is different from a width of the fourth portion of the encapsulant.

11. The method of claim 1, further comprising: forming the sacrificial material on an upper surface of the substrate while forming the sacrificial material over the substrate, wherein a level of an upper surface of the sacrificial material is lower than a level of an upper surface of the electronic component.

12. The method of claim 11, wherein the level of the upper surface of the sacrificial material is higher than a level of a lower surface of the electronic component with respect to the substrate.

* * * * *